(12) United States Patent
Hwang et al.

(10) Patent No.: US 11,791,308 B2
(45) Date of Patent: Oct. 17, 2023

(54) SEMICONDUCTOR PACKAGE

(71) Applicant: SAMSUNG ELECTRONICS CO., LTD., Suwon-si (KR)

(72) Inventors: Jihwan Hwang, Hwaseong-si (KR); Unbyoung Kang, Hwaseong-si (KR); Sangsick Park, Hwaseong-si (KR); Jihwan Suh, Suwon-si (KR); Soyoun Lee, Hwaseong-si (KR); Teakhoon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/804,110

(22) Filed: May 26, 2022

(65) Prior Publication Data
US 2022/0285312 A1  Sep. 8, 2022

Related U.S. Application Data

(63) Continuation of application No. 17/142,133, filed on Jan. 5, 2021, now Pat. No. 11,362,062.

(30) Foreign Application Priority Data

May 26, 2020 (KR) ........................ 10-2020-0063275

(51) Int. Cl.
*H01L 23/00* (2006.01)
*H01L 25/065* (2023.01)
*H01L 23/498* (2006.01)

(52) U.S. Cl.
CPC ........ *H01L 24/83* (2013.01); *H01L 23/49816* (2013.01); *H01L 24/13* (2013.01); *H01L 25/0657* (2013.01)

(58) Field of Classification Search
CPC ....... H01L 24/83; H01L 23/498; H01L 24/13; H01L 2224/95; H01L 2225/06513; H01L 2225/06517
See application file for complete search history.

(56) References Cited

U.S. PATENT DOCUMENTS

| | | | |
|---|---|---|---|
| 5,994,783 | A | 11/1999 | You |
| 6,481,482 | B1 | 11/2002 | Shimotomai |
| 7,537,670 | B2 | 5/2009 | Takeyama |
| 8,278,142 | B2 | 10/2012 | Takahashi |

(Continued)

FOREIGN PATENT DOCUMENTS

KR  10-0239695  10/1999

*Primary Examiner* — Thao P Le
(74) *Attorney, Agent, or Firm* — F. Chau & Associates, LLC

(57) ABSTRACT

A semiconductor package includes a base chip and at least one semiconductor chip disposed on the base chip. An adhesive film is disposed between the base chip and the at least one semiconductor chip and is configured to fix the at least one semiconductor chip on the base chip. The adhesive film includes an inner film portion that overlaps the at least one semiconductor chip in a thickness direction of the base chip, and an outer film portion that does not overlap the at least one semiconductor chip in the thickness direction of the base chip. A width of the outer film portion in a direction perpendicular to a lateral edge of the at least one semiconductor chip is substantially uniform within a deviation range of 20% of an average width of the outer film portion.

20 Claims, 22 Drawing Sheets

(56) References Cited

U.S. PATENT DOCUMENTS

| | | |
|---|---|---|
| 8,616,433 B2 | 12/2013 | Huang et al. |
| 9,613,832 B2 | 4/2017 | Kasai et al. |
| 10,319,890 B2 | 6/2019 | Tischler et al. |
| 2011/0198740 A1 | 8/2011 | Matsushima |
| 2016/0086912 A1 | 3/2016 | Lee |
| 2017/0011982 A1* | 1/2017 | Theuss ................ H01L 25/0657 |
| 2019/0170795 A1 | 6/2019 | Sugito |
| 2020/0043837 A1 | 2/2020 | Lee et al. |
| 2021/0151410 A1* | 5/2021 | Hwang ............... H01L 25/0657 |
| 2021/0217680 A1 | 7/2021 | Ooshima et al. |
| 2021/0305117 A1 | 9/2021 | Lee et al. |
| 2021/0373182 A1 | 12/2021 | Kyushima et al. |
| 2021/0375823 A1 | 12/2021 | Hwang et al. |
| 2021/0389482 A1 | 12/2021 | Kyushima et al. |
| 2021/0402771 A1 | 12/2021 | Tomimatsu et al. |
| 2022/0293563 A1* | 9/2022 | Ko ...................... H01L 25/0652 |
| 2023/0010936 A1* | 1/2023 | Jin ....................... H01L 23/5226 |
| 2023/0038603 A1* | 2/2023 | Choi ...................... H01L 24/06 |

* cited by examiner

SEMICONDUCTOR PACKAGE

CROSS-REFERENCE TO RELATED APPLICATIONS

This application is a continuation of U.S. patent application Ser. No. 17/142,133 filed on Jan. 5, 2021, which claims priority under 35 U.S.C. § 119 to Korean Patent Application No. 10-2020-0063275, filed on May 26, 2020 in the Korean Intellectual Property Office, the disclosures of which are incorporated by reference in their entireties herein.

TECHNICAL FIELD

The present inventive concepts relate to a semiconductor package, and more specifically, to a semiconductor package including a semiconductor chip that is stacked through an adhesive film.

As the electronic industry experiences rapid development, electronic devices have become increasingly smaller (e.g., miniaturized) and lighter. With the miniaturization and lightening of electronic devices, semiconductor packages used in the electronic devices are also becoming miniaturized and lightweight. However, the semiconductor packages should provide high performance, high capacity, and high reliability. Research and development has been conducted concerning a semiconductor package having a structure in which the semiconductor chips are stacked in multiple layers to provide miniaturization, light weight, high performance, high capacity, and high reliability.

SUMMARY

An objective of exemplary embodiments of the present inventive concepts is to provide a semiconductor package having a multi-layer stack structure having high reliability.

According to exemplary embodiment of the present inventive concepts, a semiconductor package includes a base chip and at least one semiconductor chip disposed on the base chip. An adhesive film is disposed between the base chip and the at least one semiconductor chip and is configured to fix the at least one semiconductor chip on the base chip. The adhesive film includes an inner film portion that overlaps the at least one semiconductor chip in a thickness direction of the base chip, and an outer film portion that does not overlap the at least one semiconductor chip in the thickness direction of the base chip. A width of the outer film portion in a direction perpendicular to a lateral edge of the at least one semiconductor chip is substantially uniform within a deviation range of 20% of an average width of the outer film portion.

According to another exemplary embodiment of the present inventive concepts, a semiconductor package includes a package substrate and a silicon interposer disposed on the package substrate. At least one chip structure is disposed on the silicon interposer. A first adhesive film is configured to fix and adhere the chip structure on the silicon interposer. The first adhesive film includes a first inner film portion that overlaps the chip structure in a thickness direction of the silicon interposer and a first outer film portion that does not overlap the chip structure in the thickness direction of the silicon interposer. A width of the first outer film portion in a direction perpendicular to a lateral edge of the chip structure is substantially uniform within a deviation range of 20% of an average width of the first outer film portion.

According to another exemplary embodiment of the present inventive concepts, a semiconductor package includes a base chip and at least one semiconductor chip disposed on the base chip. The at least one semiconductor chip has a plurality of bumps disposed on a lower surface thereof. The at least one semiconductor chip has a rectangular shape. An adhesive film is disposed between the base chip and the at least one semiconductor chip and is configured to fix the at least one semiconductor chip on the base chip. The adhesive film includes an inner film portion that overlaps the at least one semiconductor chip in a thickness direction of the base chip, and an outer film portion that does not overlap the at least one semiconductor chip in the thickness direction of the base chip. A width of the outer film portion is defined in a direction perpendicular to a lateral edge of the at least one semiconductor chip, and the following Equation (1) is satisfied, $$Ws - Wc \leq Ws * 0.2 \qquad \text{<Equation (1)>}$$

Ws is a width of the outer film portion adjacent to the lateral edge of the semiconductor chip, Wc is a width of the outer film portion adjacent to a vertex of the semiconductor chip, and Ws and Wc are greater than 0.

BRIEF DESCRIPTION OF THE DRAWINGS

Exemplary embodiments of the present inventive concepts will be more clearly understood from the following detailed description taken in conjunction with the accompanying drawings in which.

DETAILED DESCRIPTION OF EXEMPLARY EMBODIMENTS

Figure 1A:
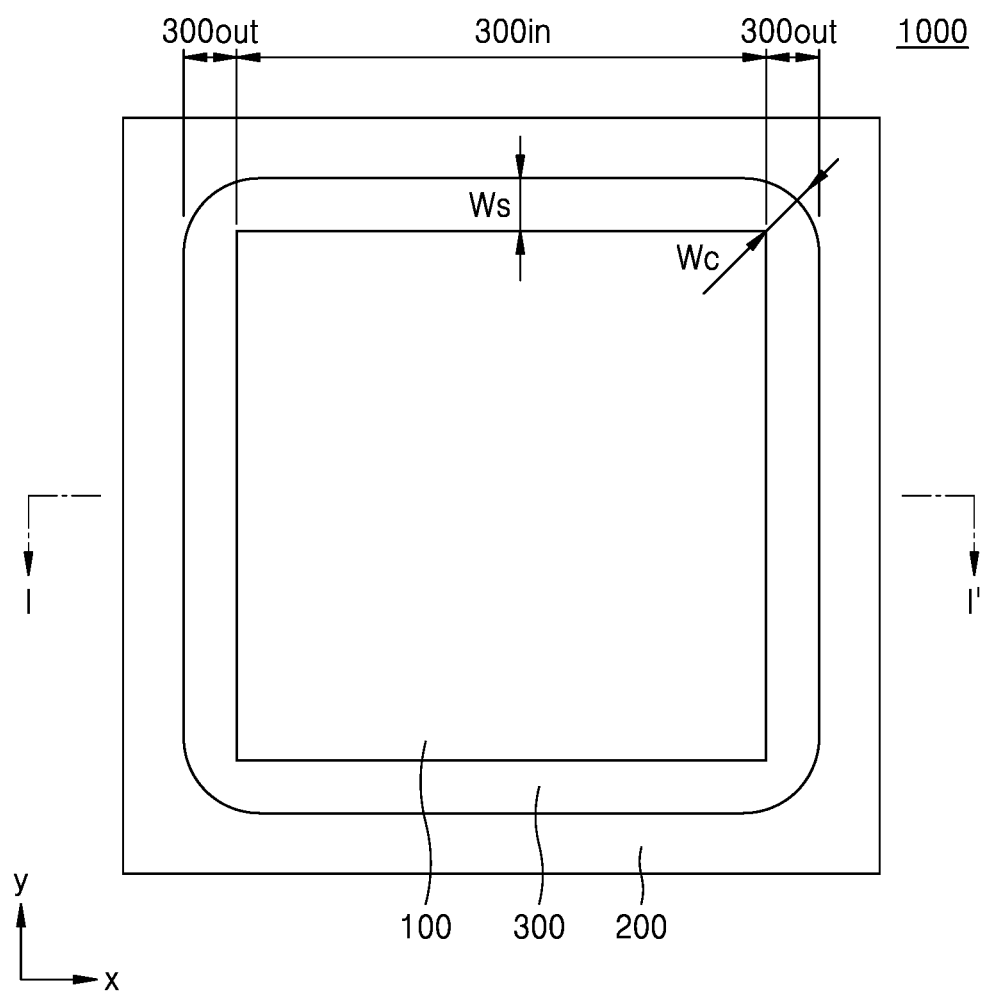
FIG. 1A is a plan view of a semiconductor package according to an exemplary embodiment of the present inventive concepts.

Hereinafter, exemplary embodiments of the present inventive concepts will be described in detail with reference to the accompanying drawings. Like reference numerals refer to like elements throughout the drawings, and repeated descriptions thereof will be omitted for convenience of explanation.

Figure 1B:
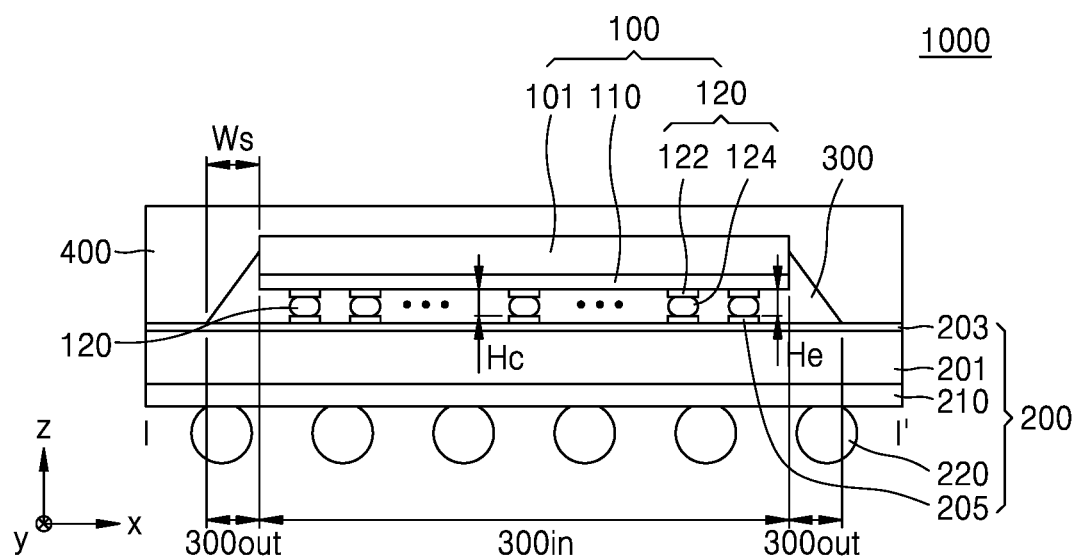
FIG. 1B is a cross-sectional view of a semiconductor package taken along line I-I' of FIG. 1A according to an exemplary embodiment of the present inventive concepts.

FIGS. 1A and 1B are a plan view and a cross-sectional view of a semiconductor package according to exemplary embodiments of the present inventive concepts, and FIG. 1B is a cross-sectional view taken along line I-I' of FIG. 1A.

Referring to the exemplary embodiments of FIGS. 1A and 1B, a semiconductor package 1000 may include a semiconductor chip 100, a base chip 200, an adhesive film 300, and a sealing material 400.

In an exemplary embodiment, the base chip 200 may be formed of a semiconductor material such as a silicon (Si) wafer. However, exemplary embodiments of the present inventive concepts are not limited thereto and the base chip 200 may be a PCB or a glass substrate that does not include a semiconductor material in other exemplary embodiments. Hereinafter, the base chip 200 based on a semiconductor material will be described for convenience of explanation.

The base chip 200 may include a substrate 201, an upper protection layer 203, an upper pad 205, a device layer 210, and an external connection terminal 220. However, in an exemplary embodiment in which the base chip 200 is a PCB or a glass substrate that does not include a semiconductor material, the base chip 200 may not include the device layer.

The substrate 201 may include a semiconductor element such as silicon or germanium (Ge). In addition, the substrate 201 may include a compound semiconductor such as silicon carbide (SiC), gallium arsenide (GaAs), indium arsenide (InAs), or indium phosphide (InP). However, exemplary embodiments of the present inventive concepts are not limited thereto. The substrate 201 may have a silicon on insulator (SOI) structure. For example, the substrate 201 may include a buried oxide (BOX) layer. The substrate 201 may include a conductive region, for example, an impurity-doped well or an impurity-doped structure. The substrate 201 may include various isolation structures such as a shallow trench isolation (STI) structure. According to an exemplary embodiment, the base chip 200 may include a through silicon via (TSV) that penetrates the substrate 201. The TSV will be described in more detail with reference to the exemplary embodiment of FIG. 3A.

The upper protection layer 203 may be disposed on an upper surface of the substrate 201 to protect the substrate 201. For example, as shown in the exemplary embodiment of FIG. 1B, a lower surface of the upper protection layer 203 may directly contact an upper surface of the substrate 201. In an exemplary embodiment, the upper protection layer 203 may include an insulation layer such as at least one layer selected from a silicon oxide layer, a silicon nitride layer, and a silicon oxynitride layer. However, exemplary embodiments of the present inventive concepts are not limited thereto and a material of the upper protection layer 203 may vary. For example, the upper protection layer 203 may be formed of a polymer such as polyimide (PI). In an exemplary embodiment, a lower protection layer may be formed on a lower surface of the device layer 210.

The upper pad 205 may be disposed on the upper protection layer 203. For example, as shown in the exemplary embodiment of FIG. 1B, a lower surface of the upper pad 205 may directly contact an upper surface of the upper protection layer 203. In an exemplary embodiment, the upper pad 205 may have a flat quadrangular plate shape. However, exemplary embodiments of the present inventive concepts are not limited thereto and the shape of the upper pad 205 may vary in other exemplary embodiments. For example, the upper pad 205 may have a circular or elliptical plate shape or a polygonal plate shape other than a quadrangle. In an exemplary embodiment, the upper pad 205 may include at least one compound selected from aluminum (Al), copper (Cu), nickel (Ni), tungsten (W), platinum (Pt), and gold (Au). However, a material of the upper pad 205 is not limited thereto.

The device layer 210 may be disposed on a lower surface of the substrate 201. For example, as shown in the exemplary embodiment of FIG. 1B, an upper surface of the device layer 210 may directly contact a lower surface of the substrate 201. The device layer 210 may include various kinds of devices. For example, the device layer 210 may include a field effect transistor (FET) such as a planar FET or a FinFET, a memory device such as flash memory, dynamic random access memory (DRAM), static random access memory (SRAM), electrically erasable programmable read-only memory (EEPROM), phase-change random access memory (PRAM), magnetoresistive random access memory (MRAM), ferroelectric random access memory (FeRAM) or resistive random access memory (RRAM), a logic device such as an AND, OR, or NOT gate, or various active devices and/or passive devices such as a system large scale integration (LSI), a CMOS imaging sensor (CIS), a micro-electro-mechanical system (MEMS).

The device layer 210 may include a multi-layer wiring layer on a lower surface thereof. The multi-layer wiring layer may include a multi-layer wiring line and/or a vertical contact. The multi-layer wiring layer may connect devices of the device layer 210 to each other, connect the devices to a conductive region of the substrate 101, or connect the devices to the external connection terminal 220.

The external connection terminal 220 may be disposed on a lower surface of the device layer 210 and may be connected to a wiring line or a TSV within the device layer 210. In addition, the external connection terminal 220 may be formed of a solder ball. However, exemplary embodiments of the present inventive concepts are not limited thereto. For example, in another exemplary embodiment, the external connection terminal 220 may have a structure including a pillar and a solder. In this exemplary embodiment, the semiconductor package 1000 may be mounted on (e.g., disposed on) an external substrate such as an interposer or a package substrate through the external connection terminal 220.

In an exemplary embodiment, the base chip 200 of the semiconductor package 1000 may be, for example, an interface chip including a plurality of logic devices and/or memory devices in the device layer 210. Accordingly, the base chip 200 may transfer a signal from the semiconductor chip 100 stacked thereon to the outside and transfer a signal and power from the outside to the semiconductor chip 100. The base chip 200 may perform both a logic function and a memory function through logic devices and memory devices. However, exemplary embodiments of the present inventive concepts are not limited thereto. For example, in another exemplary embodiment, the base chip 200 may include only logic, devices to perform only a logic function.

The semiconductor chip 100 may be stacked on the base chip 200. Although, the semiconductor package 1000 shown in the exemplary embodiment of FIG. 1 includes only one semiconductor chip 100 stacked on the base chip 200, the number of semiconductor chips 100 stacked on the base chip 200 is not limited thereto. For example, a plurality of semiconductor chips 100 may be stacked on the base chip 200. A structure in which a plurality of semiconductor chips 100 are stacked on the base chip 200 will be described in more detail with reference to the exemplary embodiments of FIGS. 3A and 3B.

The semiconductor chip 100 may include a substrate 101, a device layer 110, and bumps 120. In an exemplary embodiment, the substrate 101 may include a semiconductor material such as a silicon wafer. The substrate 101 is the same as that described above with regard to the substrate 201 of the base chip 200 based on the semiconductor material.

The device layer 110 may include a plurality of memory devices. For example, the device layer 110 may include volatile memory devices such as DRAM and SRAM or nonvolatile memory devices such as PRAM, MRAM, FeRAM, and RRAM. For example, in an exemplary embodiment, the semiconductor chip 100 of the semiconductor package 1000 may include DRAM devices in the device layer 110. Accordingly, the semiconductor package 1000 according to this exemplary embodiment may be used in a high bandwidth memory (HBM) product, an electro date processing (EDP) product, or the like.

The device layer 110 may include a multi-layer wiring layer on a lower surface thereof. The multi-layer wiring layer is the same as that described above with regard to the multi-layer wiring layer of the device layer 210 of the base chip 200. Accordingly, the devices of the device layer 110 may be electrically connected to the bump 120 through the multi-layer wiring layer.

In an exemplary embodiment, while the base chip 200 may include a plurality of logic devices and/or memory devices in the device layer 210 and may be referred to as a buffer chip or a control chip according to the functions thereof, the semiconductor chip 100 may include a plurality of memory devices in the device layer 110 and may be referred to as a core chip.

The bump 120 may be disposed on a lower surface of the device layer 110, and may be connected to the devices of the device layer 110 through the wiring line of the multi-layer wiring layer. For example, as shown in the exemplary embodiment of FIG. 1B, a lower surface of the device layer 110 may directly contact an upper surface of the bump 120. However, exemplary embodiments of the present inventive concepts are not limited thereto. For example, in an exemplary embodiment, a chip pad may be disposed on a lower surface of the device layer 110, and the bump 120 may be disposed on the chip pad.

In an exemplary embodiment, the bump 120 may include, for example, a pillar 122 and a solder 124. In an exemplary embodiment, the pillar 122 may have a cylindrical shape or a polygonal pillar shape such as a square pillar or an octagonal pillar, and may include, for example, nickel (Ni), copper (Cu), palladium (Pd), platinum (Pt), gold (Au), or a combination thereof. The solder 124 may be disposed on the pillar and may have a spherical or ball shape. The solder 124 may include, for example, tin (Sn), indium (In), bismuth (Bi), antimony (Sb), copper (Cu), silver (Ag), zinc (Zn), lead (Pb), and/or an alloy thereof. For example, the solder 124 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn. According to an exemplary embodiment, the bump 120 may include only the solder 124 and may not include the pillar 122.

Due to the structural characteristics of the adhesive film 300, the bump 120 of the semiconductor package 1000 according to an exemplary embodiment of the present inventive concepts may maintain a substantially uniform height throughout the semiconductor chip 100 within a deviation range. For example, in an exemplary embodiment, the bump 120 may have a height in a range of about 13.7 µm to about 15.5 µm throughout the semiconductor chip 100. For example, in the semiconductor package 1000 according to an exemplary embodiment, a height Hc of the bump 120 may be disposed at a center portion of the semiconductor chip 100. For example, the height Hc of the bump may be disposed at a center portion of the semiconductor chip 100 in a first direction along the x axis (hereinafter, the "X direction") and/or in a second direction along the y axis (hereinafter, the "Y direction" which are both parallel to an upper surface of the substrate 201. The height Hc of the bump may be about 13.8 µm, and a height may be of the bump 120 arranged at a lateral edge portion of the semiconductor chip 100 (e.g., in the X direction) may be about 15.4 µm. For reference, among the pillar 122 and the solder 124 constituting the bump 120, a height of the pillar 122 may be fixed at a constant level, and a height of the solder 124 may vary depending on a position of the semiconductor chip 100 due to a reflow process, etc. For example, a height of the solder 124 or the bump 120 at a lateral edge portion of the semiconductor chip 100 may be greater than the height of the solder 124 or the bump 120 at a center portion of the semiconductor chip 100 according to wetting of the solder 124 due to reflow of the adhesive film 300 and warpage of the semiconductor chip 100 due to a high temperature in the reflow process.

In a comparative embodiment of a semiconductor package in which a semiconductor chip is stacked on a base chip through a conventional temperature-compression bonding (TCB) process, the height Hc of the bump at a center portion of the semiconductor chip may be about 14.5 µm, and the height He of the bump at a lateral edge portion of the semiconductor chip may be about 17.9 µm. Accordingly, compared to the conventional semiconductor package, the height of the bump 120 of the semiconductor package 1000 according to an exemplary embodiment of the present inventive concepts is decreased by about 0.7 µm at a center portion and by about 2.5 µm at a lateral edge portion.

Comparing the numerical values of a height of the bump in various cases, a height of a power bump arranged at a lateral edge portion of a semiconductor chip in a conventional semiconductor package and supplied with power is about 15.1 µm. However, in the semiconductor package 1000 according to this exemplary embodiment, a height of a power bump arranged at a lateral edge portion of the semiconductor chip 100 may be about 9.3 µm. Accordingly, compared to the conventional semiconductor package, the height of the power bump of the semiconductor package 1000 according to an exemplary embodiment of the present inventive concepts is decreased by about 5 µm to about 6 µm. Furthermore, while in the conventional semiconductor package, a height of a signal bump disposed at a lateral edge portion of a semiconductor chip and applied with a signal is about 14.0 µm, in the semiconductor package 1000 according to this exemplary embodiment, a height of a signal bump disposed at a lateral edge portion of the semiconductor chip 100 is about 10.9 µm. Therefore, the height of the signal bump at a lateral edge portion of the semiconductor package 1000 according to this exemplary embodiment is decreased by about 2.5 to about 3 µm. In addition, while in the conventional semiconductor package, a height of the signal bump at a center portion of the semiconductor chip is about 13.8 µm, in the semiconductor package 1000 according to an exemplary embodiment of the present inventive concepts, a height of the signal bump at a center portion of the semiconductor chip 100 is about 12.1 μm. Therefore, the height of the signal bump at a center portion of the semiconductor package 1000 according to this exemplary embodiment is decreased by about 1.5 to about 2 μm.

The adhesive film 300 may be disposed between the base chip 200 and the semiconductor chip 100 to surround lateral sides of the bump 120. As shown in the exemplary embodiment of FIG. 1B, the adhesive film 300 may protrude from lateral side surfaces of the semiconductor chip 100 toward the outside and may cover at least a portion of the lateral sides of the semiconductor chip 100. The adhesive film 300 may be, for example, a non-conductive film (NCF). However, the adhesive film 300 is not limited to the NCF. For example, the adhesive film 300 may include various kinds of polymer films that may be subjected to a pressurized reflow process. The pressurized reflow process may refer to a process of reflowing the adhesive film 300 by applying heat while maintaining a constant pressure in a process chamber. The pressure applied during the pressurized reflow process may be a kind of hydrostatic pressure, and a magnitude of the pressure applied to an arbitrary surface of the semiconductor chip 100 may be constant regardless of a direction.

The adhesive film 300 may include an inner film portion 300in that overlaps the semiconductor chip 100 in a third direction along the z axis (hereinafter, the "Z direction") which is a thickness direction of the substrate 201. The adhesive film 300 may also include an outer film portion 300out that does not overlap the semiconductor chip 100 (e.g., in the Z direction) and protrudes from the lateral sides of the semiconductor chip 100. The outer film portion 300out may be referred to as a filet. A width of the outer film portion 300out may be defined as a length of the outer film portion 300out in a direction perpendicular to the lateral edge of the semiconductor chip 100 which extends in the Z direction. For example, the width may be the length of the outer film portion 300out in a direction parallel to an upper surface of the substrate 201 (e.g., in the X direction). In addition, the width of the outer film portion 300out may be defined as a portion protruding outwardly the most from the lateral edge of the semiconductor chip 100 regardless of the height from the upper surface of the base chip 200.

In addition, as shown in the exemplary embodiment of FIG. 1A, the width of the outer film portion 300out may have a side width Ws (e.g., length in the X or Y direction) and a corner width Wc (e.g., length in a direction between the X and Y directions that is parallel to an upper surface of the substrate 201). The side width Ws may refer to a width of the outer film portion 300out adjacent to a lateral edge portion of the semiconductor chip 100 when the semiconductor chip 100 is viewed as a square. In addition, the corner width Wc may refer to a width of the outer film portion 300out adjacent to a vertex or corner portion of the semiconductor chip 100. As shown in the exemplary embodiments of FIGS. 1A and 1B, the side width Ws may be represented as a length in the X or Y direction from a side adjacent to a lateral edge of the semiconductor chip 100. In addition, the corner width Wc may be represented as a length in a direction between the X and Y directions on a side adjacent to the corner of the semiconductor chip 100.

In the semiconductor package 1000 according to this exemplary embodiment, the width of the outer film portion 300out may be substantially uniform within a deviation range, for example, within a deviation range of about 20% of the average width of the outer film portion 300out. To describe by applying specific values, if the average width of the outer film portion 300out is about 220 μm, the maximum width of the outer film portion 300out may be about 260 μm and the minimum width may be about 180 μm.

Due to the pressurized reflow process, the side width Ws may be generally greater than the corner width Wc. For example, a distance from the center of the semiconductor chip 100 to a corner portion of the semiconductor chip 100 is greater than a distance from the center of the semiconductor chip 100 to the side of the semiconductor chip 100, and thus, the distance that the adhesive film 300 flows to the corner portion in the pressure-reflow process may be greater.

In the semiconductor package 1000 according to the this exemplary embodiment, the width of the outer film portion 300out is substantially uniform within a deviation range, and accordingly, the side width Ws and the corner width Wc of the outer film portion 300out may satisfy the following Equation (1).

$$Ws - Wc \leq Ws * 0.2 \qquad \text{<Equation (1)>}$$

In Equation (1), the side width Ws and the corner width Wc may be greater than 0. When applying specific values to Equation (1), if the side width Ws is about 240 μm, the corner width Wc may be about 190 μm or greater.

When a semiconductor chip is stacked on a substrate or another semiconductor chip through a conventional TCB process, an adhesive film flows to a lateral edge portion of the semiconductor chip through the reflow of the adhesive film, and the flow of the adhesive film to a corner portion may be small. Accordingly, a corner width of an outer adhesive film portion may be small or have a negative width. For example, the negative width of the outer adhesive film portion may be generated in a state in which the corner portion is insufficiently filled with the adhesive film such that the adhesive film does not protrude toward the outside of the semiconductor chip. The shape of such corner portion of the adhesive film may increase a joint gap together with warpage of the semiconductor chip, and may cause an open defect due to not-wetting of the bump. The joint gap may refer to a distance between a semiconductor chip and a substrate or between a semiconductor chip and another semiconductor chip to be coupled by a bump.

On the other hand, in the semiconductor package 1000 according to an exemplary embodiment of the present inventive concepts, the adhesive film 300 is sufficiently filled in the corner portion of the semiconductor chip 100, and the width of the outer film portion 300out may be uniform within a range. Accordingly, in the semiconductor package 1000 according to this exemplary embodiment, warpage of the semiconductor chip 100 may be suppressed, the joint gap may be reduced, and the wetting of the bump may be smooth, thereby greatly reducing open defects. As a result, the yield and productivity of the semiconductor package 1000 may be improved and the productivity may be maximized.

In the semiconductor package 1000 according to this exemplary embodiment, the substantially uniform width of the outer film portion 300out within a deviation range and the substantially uniform height of the bump 120 throughout the semiconductor chip 100 may be due to the performing of a foil lamination process of covering semiconductor chips on a wafer (refer to 200w of FIG. 8A) before performing the pressurized reflow process. Stacking of the semiconductor chip 100 through the foil lamination and pressurized reflow processes will be described in more detail with reference to FIGS. 8A to 12.

The sealing material 400 may cover a portion of the upper surface of the base chip 200, the upper surface of the semiconductor chip 100, the lateral sides of the semiconductor chip 100, and the lateral sides of the adhesive film 300. As shown in the exemplary embodiment of FIG. 1B, the sealing material 400 may cover the upper surface of the semiconductor chip 100. However, exemplary embodiments of the present inventive concepts are not limited thereto and in other exemplary embodiments the sealing material 400 may not cover the upper surface of the semiconductor chip 100. Accordingly, the upper surface of the semiconductor chip 100 may be exposed to the outside from the sealing material 400. In an exemplary embodiment, the sealing material 400 may include, for example, an epoxy mold compound (EMC). However, exemplary embodiments of the present inventive concepts are not limited thereto and the materials of the sealing material 400 may vary in other exemplary embodiments.

In the semiconductor package 1000 according to an exemplary embodiment, the foil lamination process provides a uniform width of the outer film portion 300out within a range, and the height of the bump 120 may be uniform throughout the semiconductor chip 100. Accordingly, in the semiconductor package 1000 according to this exemplary embodiment, warpage of the semiconductor chip 100 may be minimized, open defects may be minimized, and the total height of the semiconductor package 1000 may be decreased.

Figure 2:
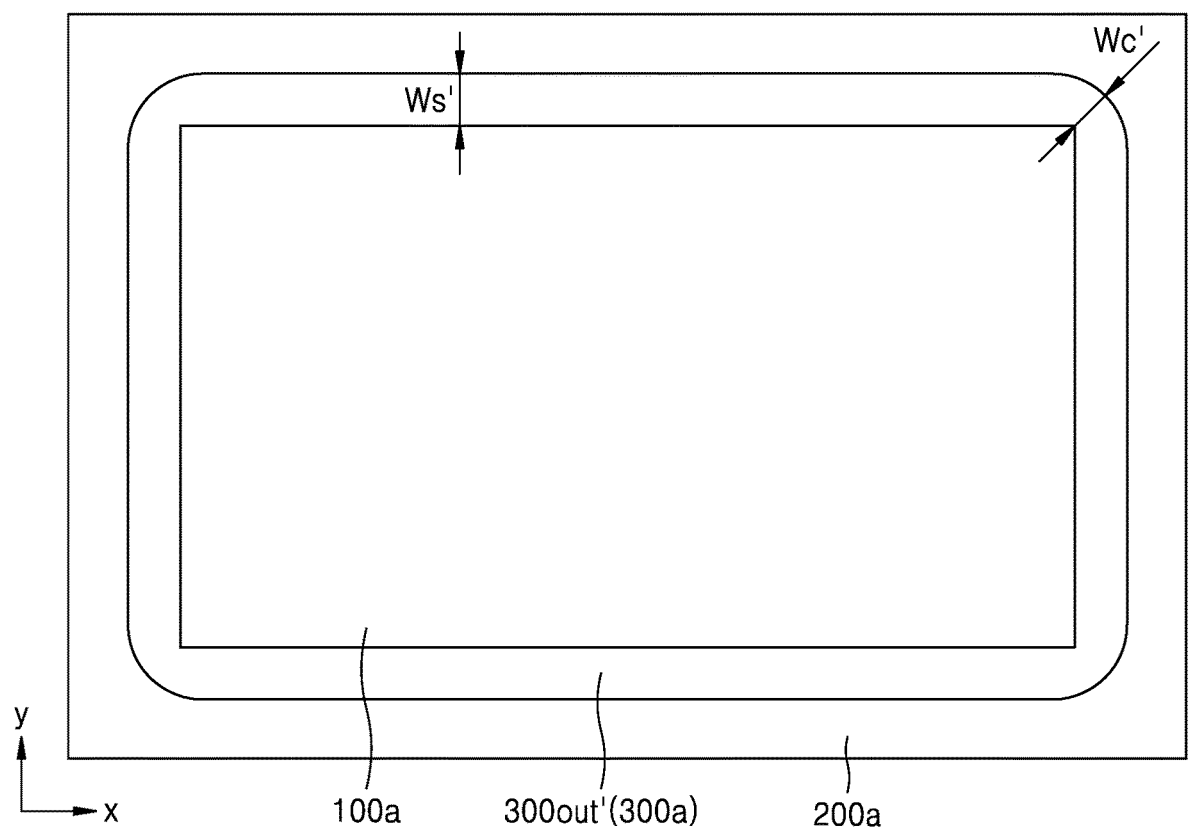
FIG. 2 is a plan view of a semiconductor package according to an exemplary embodiment of the present inventive concepts.

FIG. 2 is a plan view of a semiconductor package according to an exemplary embodiment of the present inventive concepts, and corresponds to FIG. 1A. Descriptions of substantially identical elements previously given with respect to FIGS. 1A and 1B will be briefly given or omitted for convenience of explanation.

Referring to FIG. 2, a semiconductor package 1000a according to this exemplary embodiment may be substantially the same as the semiconductor package 1000 of FIG. 1A, except that a base chip 200a and a semiconductor chip 100a have a rectangular shape extending longer in one direction. Accordingly, in the semiconductor package 1000a according to this exemplary embodiment, a width of an outer film portion 300out' of an adhesive film 300a may be substantially uniform within a deviation range, and a height of a bump (refer to 120 of FIG. 1B) may be uniform throughout the semiconductor chip 100a.

In the semiconductor package 1000a of this exemplary embodiment, since the width of the outer film portion 300out' is uniform within a range, a side width Ws' and a corner width Wc' of the outer film portion 300out' may satisfy the relationship of Equation (1) above. For example, Ws'−Wc'≤*0.2 may be satisfied. In addition, the definitions of the side width Ws' and the corner width Wc' may be substantially the same as the definitions of the side width Ws and the corner width Wc of the outer film portion 300out of the semiconductor package 1000 of FIG. 1A and may be greater than 0.

Figure 3A:
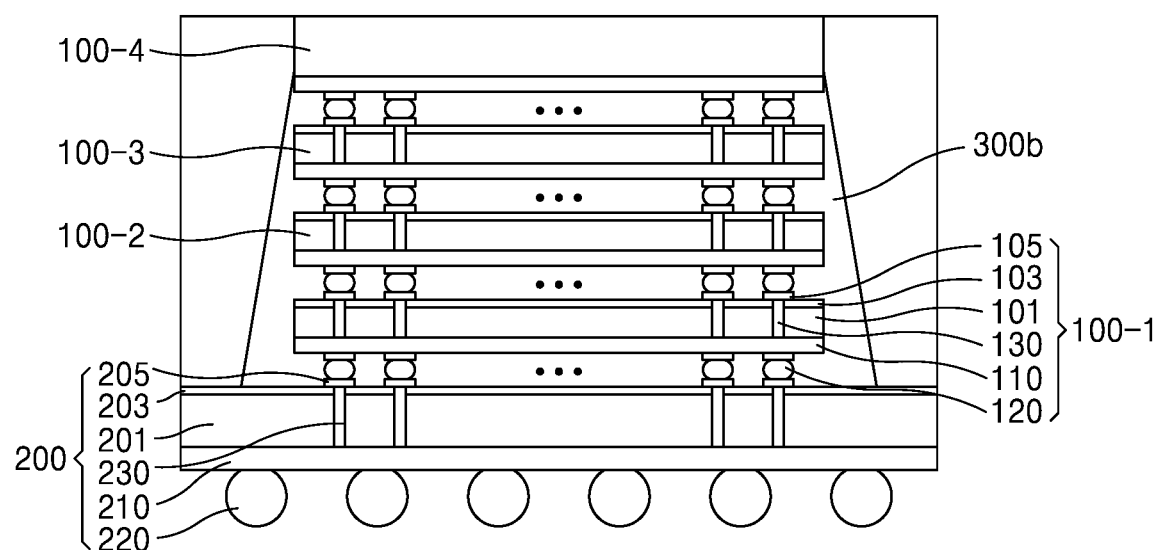
FIGS. 3A and 3B are cross-sectional views of semiconductor packages according to exemplary embodiments of the present inventive concepts.
Figure 3B:
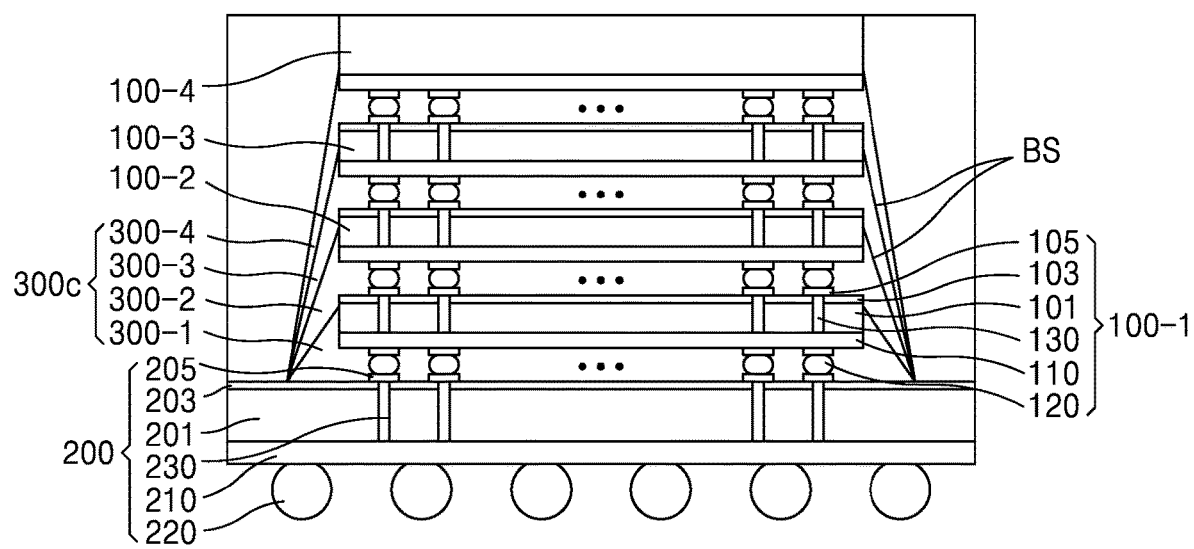

FIGS. 3A and 3B are cross-sectional views of semiconductor packages according to exemplary embodiments, and each may correspond to FIG. 1B. Descriptions of substantially identical elements previously given with respect to FIGS. 1A to 2 will be briefly given or omitted for convenience of explanation.

Referring to the exemplary embodiment of FIG. 3A, a semiconductor package 1000b may be different from the semiconductor package 1000 of FIG. 1B based on the inclusion of four semiconductor chips, for example, first, second, third, and fourth semiconductor chips 100-1, 100-2, 100-3, and 100-4. The first, second, third, and fourth semiconductor chips 100-1, 100-2, 100-3, and 100-4 are stacked on the base chip 200, and the base chip 200 and the first to third semiconductor chips 100-1 to 100-3 include TSVs 230 and 130. In the semiconductor package 1000b according to this exemplary embodiment, for example, the first to fourth semiconductor chips 100-1 to 100-4 may be stacked on the base chip 200. However, the number of semiconductor chips stacked on the base chip 200 is not limited to four. For example, in another exemplary embodiment, two, three, or five or more semiconductor chips may be stacked on the base chip 200.

The base chip 200 may be, for example, an interface chip and may be substantially the same as the base chip 200 of the semiconductor package 1000 of FIG. 1B. As described above, the base chip 200 may include the TSV 230.

The TSV 230 may completely penetrate the substrate 201 or a partial portion of the substrate 201. For example, as shown in the exemplary embodiment of FIG. 3A, the TSV 230 may completely penetrate the substrate 201. In addition, the TSV 230 may extend into the device layer 210. The TSV 230 may be connected to the upper pad 205 through the upper protection layer 203 on the substrate 201. In addition, the TSV 230 may penetrate the device layer 210 to be directly connected to the external connection terminal 220, or may be connected to the external connection terminal 220 via the multi-layer wiring layer of the device layer 210.

The TSV 230 may have a pillar shape and may include a barrier layer disposed on an outer surface thereof and a buried conductive layer therein. In an exemplary embodiment, the barrier layer may include at least one material selected from Ti, TiN, Ta, TaN, Ru, Co, Mn, WN, Ni, and NiB. The buried conductive layer may include at least one material selected from Cu, a Cu alloy such as CuSn, CuMg, CuNi, CuZn, CuPd, CuAu, CuRe or CuW, W, a W alloy, Ni, Ru, and Co. A via insulation layer may be disposed between the TSV 230 and the substrate 201 or between the TSV 230 and the device layer 210. In an exemplary embodiment, the via insulation layer may include, for example, an oxide layer, a nitride layer, a carbide layer, a polymer, or a combination thereof.

Each of the first to fourth semiconductor chips 100-1 to 100-4 may be, for example, a memory chip and may have a substantially same function as the semiconductor chip 100 of the semiconductor package 1000 of the exemplary embodiment of FIG. 1B. However, each of the first to third semiconductor chips 100-1 to 100-3 may be structurally different from the semiconductor chip 100 of the semiconductor package 1000 of FIG. 1B in that each of the first to third semiconductor chips 100-1 to 100-3 further includes an upper protection layer 103 and an upper pad 105 disposed on an upper surface of the substrate 101, and the TSV 130 that penetrates the substrate 101. The upper protection layer 103 and the upper pad 105 are the same as that described above with regard to the upper protection layer 203 and the upper pad 205 of the base chip 200 of the semiconductor package 1000 of the exemplary embodiment of FIG. 1B. The TSV 130 is also the same as that described above with regard to the TSV 230 of the base chip 200. The TSV 130 of each of the first to third semiconductor chips 100-1 to 100-3 may be upwardly connected to the upper pad 105 and downwardly connected to the bump 120.

As shown in the exemplary embodiment of FIG. 3A, the fourth semiconductor chip 100-4 may not include the upper protection layer 103, the upper pad 105, and the TSV 130. Accordingly, the fourth semiconductor chip 100-4 may be substantially the same as the semiconductor chip 100 of the semiconductor package 1000 of FIG. 1B in terms of the structure. As shown in FIG. 3A, an upper surface of the fourth semiconductor chip 100-4 may not be covered by the sealing material 400. However, exemplary embodiments of the present inventive concepts are not limited thereto and the upper surface of the fourth semiconductor chip 100-4 may be covered by the sealing material 400 in other exemplary embodiments.

The first semiconductor chip 100-1 may be stacked on the base chip 200 via the bump 120 and an adhesive film 300b. In addition, each of the second to fourth semiconductor chips 100-2 to 100-4 may be stacked on a corresponding semiconductor chip via the bump 120 and the adhesive film 300b. For example, the second semiconductor chip 100-2 may be stacked on the first semiconductor chip 100-1, the third semiconductor chip 100-3 may be stacked on the second semiconductor chip 100-2, and the fourth semiconductor chip 100-4 may be stacked on the third semiconductor chip 100-3 via the bump 120 and the adhesive film 300b.

As shown in the exemplary embodiment of FIG. 3A, the adhesive film 300b may have an integrated structure. For example, a portion of the adhesive film 300b disposed between the first semiconductor chip 100 and the base chip 200 may not be distinguished from a portion of the adhesive film 300b disposed between the other semiconductor chips. As described above, the integrated structure of the adhesive film 300b may be implemented by sequentially stacking the semiconductor chips on the base chip 200, which is wafer-shaped, laminating all of the stacked semiconductor chips with a foil, and performing a pressurized reflow process. The integrated structure of the adhesive film 300b will be described in more detail with reference to the exemplary embodiments of FIGS. 13A to 13D.

As shown in the exemplary embodiment of FIG. 3A, a protruding portion of the adhesive film 300b may have a shape having a constant inclination and a width that progressively increases toward a lower portion. For example, the adhesive film 300b may have an linear incline. However, a shape of the adhesive film 300b is not limited thereto. For example, in another exemplary embodiment, a protruding portion of the adhesive film 300b may have a curved shape. However, even in the exemplary embodiment in which the protruding portion has a curved shape, the protruding portion of the adhesive film 300b may generally have a relatively wider lower portion and a relatively narrow upper portion, similar to the linear inclined shape shown in FIG. 3A.

Also in the semiconductor package 1000b according to an exemplary embodiment of the present inventive concepts, due to the foil lamination process, a width of an outer film portion of the adhesive film 300b may be substantially uniform within a deviation range, and the bump 120 of each of the first to fourth semiconductor chips 100-1 to 100-4 may maintain a substantially uniform height throughout the corresponding semiconductor chip. In the semiconductor package 1000b of this exemplary embodiment, the base chip 200 may be an interface chip, and each of the first to fourth semiconductor chips 100-1 to 100-4 may be a DRAM chip. Accordingly, the semiconductor package 1000b of this embodiment may be an HBM package.

Referring to the exemplary embodiment of FIG. 3B, a semiconductor package 1000c may be different from the semiconductor package 1000b of the exemplary embodiment of FIG. 3A in a shape of an adhesive film 300c. For example, in the semiconductor package 1000c according to the exemplary embodiment of FIG. 3B, the adhesive film 300c may be divided into four adhesive film portions that are not integral with each other, for example, first, second, third, and fourth adhesive film portions 300-1, 300-2, 300-3, and 300-4. The adhesive film 300c may include the first adhesive film portion 300-1 disposed between the first semiconductor chip 100-1 and the base chip 200, the second adhesive film portion 300-2 between the second semiconductor chip 100-2 and the first semiconductor chip 100-1, the third adhesive film portion 300-3 between the third semiconductor chip 100-3 and the second semiconductor chip 100-2, and the fourth adhesive film portion 300-4 between the fourth semiconductor chip 100-4 and the third semiconductor chip 100-3. In addition, each of the first to fourth adhesive film portions 300-1 to 300-4 may be distinguished from an adjacent adhesive film portion by a boundary surface BS disposed therebetween.

In an exemplary embodiment, this individual structure of the adhesive film 300c may be implemented by stacking the four semiconductor chips in a process in which one semiconductor chip is stacked on the base chip 200 of a wafer-type, laminating the stacked semiconductor chip with a foil, performing a pressurized reflow process, stacking another semiconductor chip on the semiconductor chip, laminating the stacked semiconductor chip with a foil, and performing a pressurized reflow process, and repeating this process the four semiconductor chips.

As shown in the exemplary embodiment of FIG. 3B, each of the protruding portions of the adhesive film 300c may have a shape having a constant inclination and a width that progressively increases toward a lower portion. However, exemplary embodiments of the present inventive concepts are not limited thereto and a shape of the adhesive film 300c may vary. For example, each of the protruding portions of the adhesive film 300c may have a curved shape. However, even in the curved shape, each of the protruding portions of the adhesive film 300c may generally have a relatively wider lower portion and a relatively narrower upper portion, similar to the inclined shape. In addition, the widths of the lower surfaces of the protruding portions of the adhesive film 300c may be substantially identical to each other, or may decrease in the order of the first adhesive film portion 300-1, the second adhesive film portion 300-2, the third adhesive film portion 300-3, and the fourth adhesive film portion 300-4.

Also in the semiconductor package 1000c according to an exemplary embodiment, due to the foil lamination process, a width of an outer film portion of the adhesive film 300c may be substantially uniform within a deviation range, and the bump 120 of each of the first to fourth semiconductor chips 100-1 to 100-4 may maintain a substantially uniform height throughout the corresponding semiconductor chip. A width of the outer film portion of the adhesive film 300c may be defined by, for example, the first adhesive film portion 300-1 which may protrude outwardly the most from the first to fourth semiconductor chips 100-1 to 100-4. However, the width of the outer film portion of the adhesive film 300c is not limited thereto. For example, in an exemplary embodiment in which the second adhesive film portion 300-2 protrudes outwardly most from the first to fourth semiconductor chips 100-1 to 100-4, the width of the outer film portion of the adhesive film 300c may be defined by the second adhesive film portion 300-2.

Figure 4:
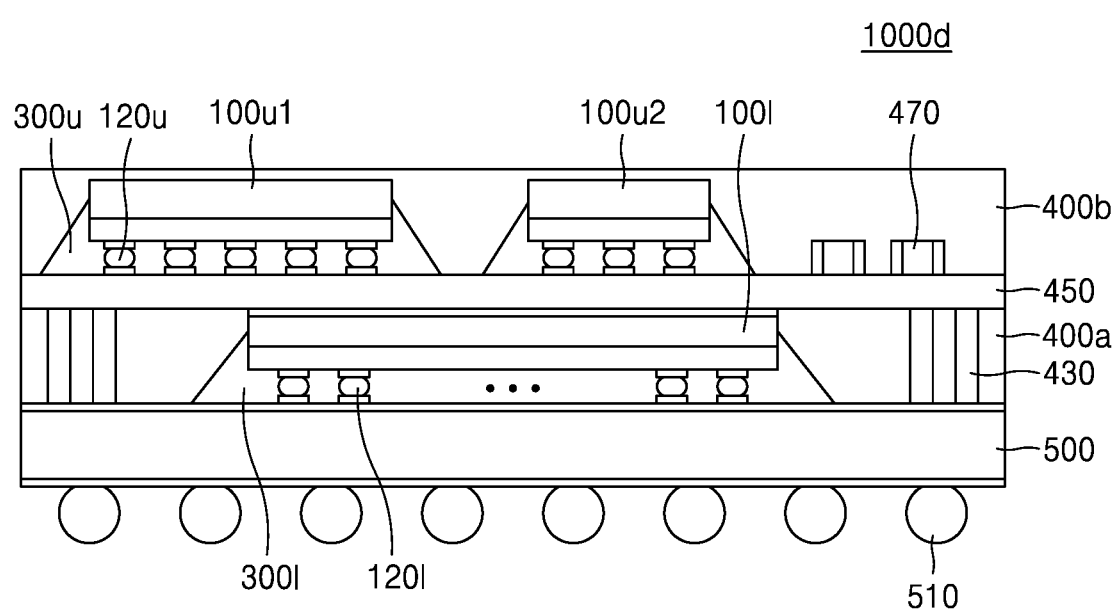
FIG. 4 is a cross-sectional view of a semiconductor package according to an exemplary embodiment of the present inventive concepts.

FIG. 4 is a cross-sectional view of a semiconductor package according to an exemplary embodiment of the present inventive concepts. Descriptions previously given with respect to substantially identical elements shown in FIGS. 1A to 3B will be briefly given or omitted for convenience of explanation.

Referring to the exemplary embodiment of FIG. 4, a semiconductor package 1000d may include a lower semiconductor chip 100*l*, first and second upper semiconductor chips 100*u*1 and 100*u*2, first and second sealing materials 400*a* and 400*b*, a through electrode 430, a rewiring structure 450, a passive device 470, and a package substrate 500.

The lower semiconductor chip 100*l* may be mounted on (e.g., disposed on) the package substrate 500 through a bump 120*l* and an adhesive film 300*l*, and may be covered and sealed by a first sealing material 400*a*. The through electrode 430 may be disposed in the first sealing material 400*a*. In an exemplary embodiment, the through electrode 430 may be formed by forming the first sealing material 400*a*, then forming a through hole that penetrates the first sealing material 400*a*, and filling the through hole with a conductive material. However, exemplary embodiments of the present inventive concepts are not limited thereto and in another exemplary embodiment, the through electrode 430 may be formed by first forming the through electrode 430, and then surrounding the through electrodes 430 with the first sealing material 400*a*.

The rewiring structure 450 may be disposed on the lower semiconductor chip 100*l* and the first sealing material 400*a*. For example, as shown in the exemplary embodiment of FIG. 4, a lower surface of the lower semiconductor chip 100*l* may directly contact upper surfaces of the first sealing material 400*a* and the lower semiconductor chip 100*l*. The rewiring structure 450 may include a rewiring line therein. The rewiring line may be connected to devices in the lower semiconductor chip 100*l* and/or the through electrode 430.

The first and second upper semiconductor chips 100*u*1 and 100*u*2 and the passive device 470 may be mounted on the rewiring structure 450 and covered and sealed by the second sealing member 400*b*. As shown in the exemplary embodiment of FIG. 4, the upper semiconductor chips may include a first upper semiconductor chip 100*u*1 and a second upper semiconductor chip 100*u*2. However, exemplary embodiments of the present inventive concepts are not limited thereto and the numbers of the upper semiconductor chips may vary in other exemplary embodiments. In an exemplary embodiment, the first upper semiconductor chip 100*u*1 and the second upper semiconductor chip 100*u*2 may be different types of memory chips. The upper semiconductor chips 100*u*1 and 100*u*2 may be stacked on the rewiring structure 450 via a bump 120*u* and an adhesive film 300*u*. Devices in the upper semiconductor chips 100*u*1 and 100*u*2 and the passive device 470 may be electrically connected to the rewiring line of the rewiring structure 450.

The package substrate 500 may be a PCB including wiring lines therein, and an external connection terminal 510 may be disposed on a lower surface thereof.

In a semiconductor package 1000*d* according to the exemplary embodiment of FIG. 4, the lower semiconductor chip 100*l* may be stacked on the package substrate 500 of a prototype by using the bump 120*l* and the adhesive film 300*l* through the foil lamination process and the pressurized reflow process. Accordingly, the width of the outer film portion of the adhesive film 300*l* may be uniform within a range, and the bump 120*l* of the lower semiconductor chip 100*l* may maintain a substantially uniform height throughout the lower semiconductor chip 100*l*.

If the first sealing material 400*a* is entirely formed on the package substrate 500 of the prototype and the rewiring structure 450 is formed on the first sealing material 400*a*, the foil lamination process and the pressurized reflow process may also be applied to the first and second upper semiconductor chips 100*u*1 and 100*u*2. Accordingly, the width of the outer film portion of the adhesive film 300*u* may be substantially uniform within a deviation range, and the bump 120*u* of each of the first and second upper semiconductor chips 100*u*1 and 100*u*2 may maintain a substantially uniform height within a deviation range throughout the upper semiconductor chips 100*u*1 and 100*u*2.

Figure 5A:
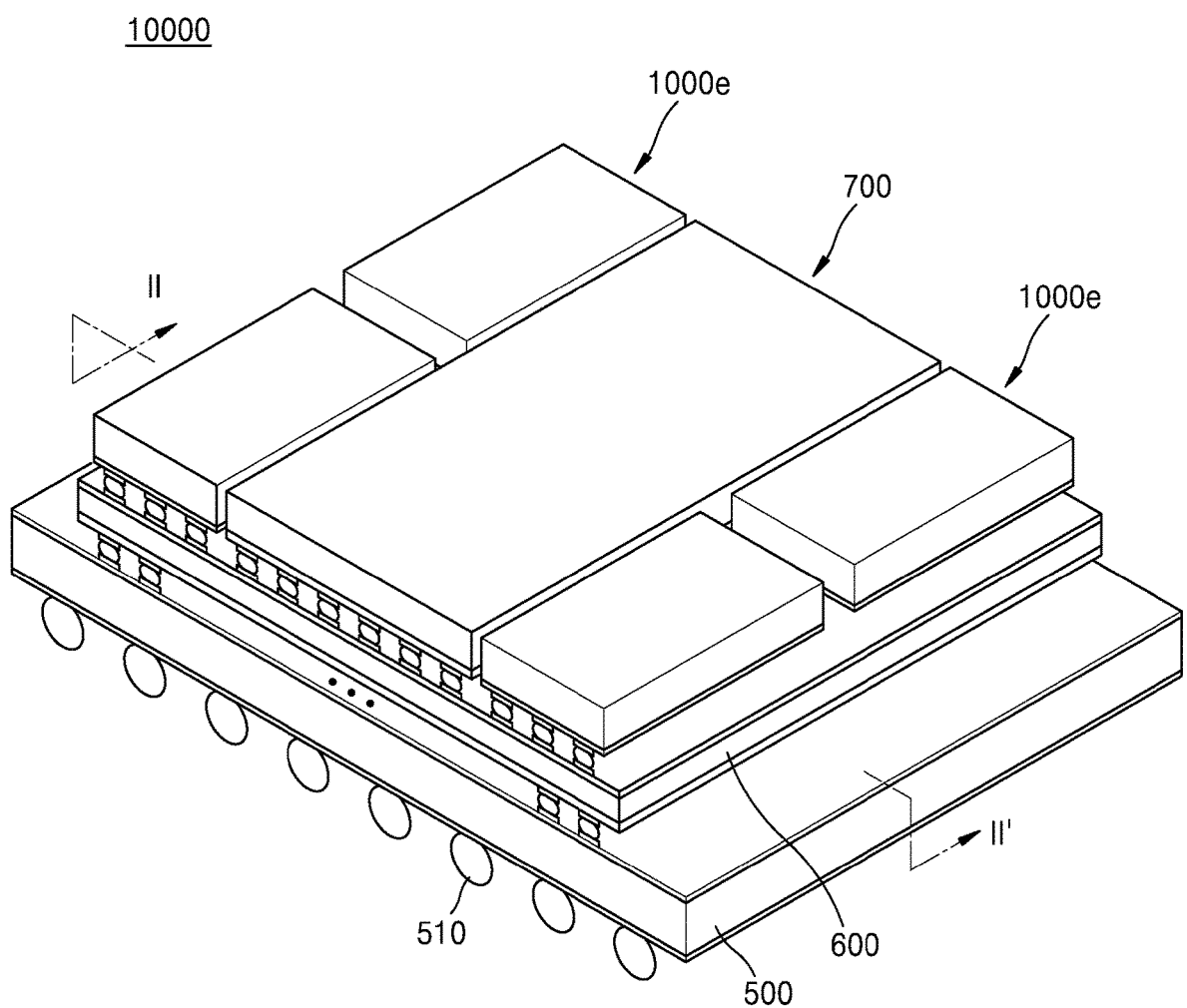
FIG. 5A is a perspective view of a semiconductor device according to an exemplary embodiment of the present inventive concepts.
Figure 5B:
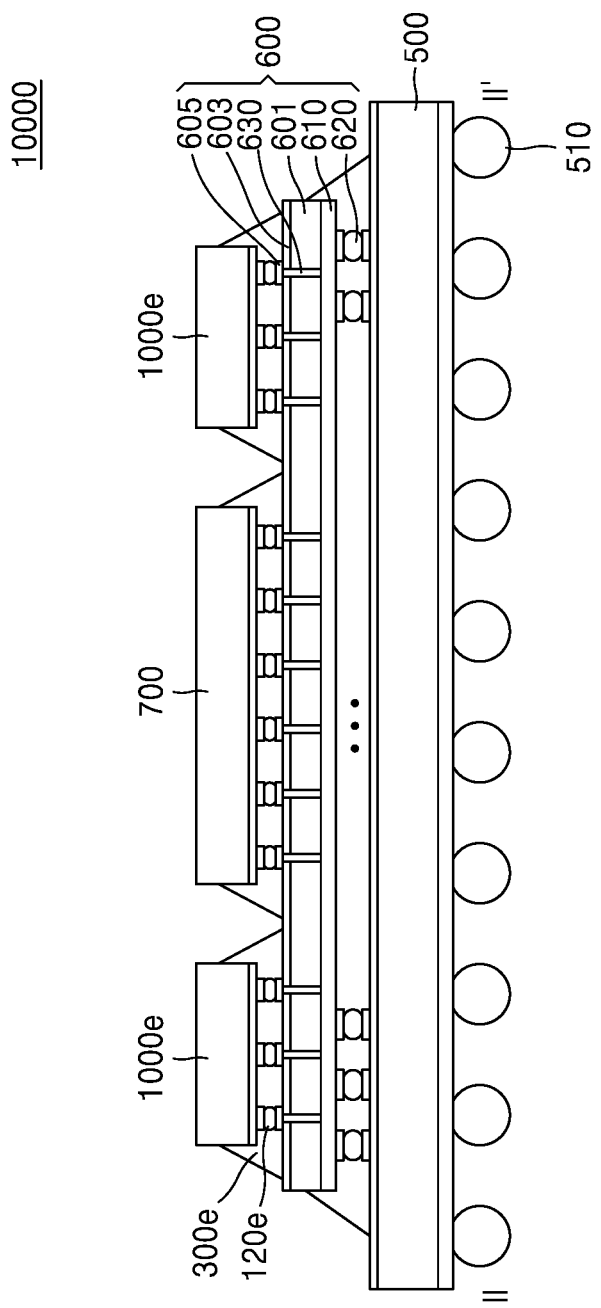
FIG. 5B is a cross-sectional view of a semiconductor device taken along line II-II' of FIG. 5A according to an exemplary embodiment of the present inventive concepts.

FIGS. 5A and 5B are a perspective view and a cross-sectional view of a semiconductor device according to an exemplary embodiment, and FIG. 5B is a cross-sectional view taken along line II-II' of FIG. 5A. Descriptions of substantially identical elements previously given with respect to FIGS. 1A to 3B will be briefly given or omitted for convenience of explanation.

Referring to the exemplary embodiments of FIGS. 5A and 5B, a semiconductor device 10000 may include a semiconductor package 1000*e*, an interposer 600, a processor chip 700, and the package substrate 500.

The semiconductor package 1000*e* may be the semiconductor package 1000*b* or 1000*c* of the exemplary embodiments of FIG. 3A or 3B. Accordingly, in the semiconductor package 1000*e*, the width of the outer film portion of the adhesive film 300*b* or 300*c* may be substantially uniform within a deviation range, and the bump 120 of each semiconductor chip may maintain a substantially uniform height within a deviation range throughout the corresponding semiconductor chip. In the semiconductor device 10000 according to this exemplary embodiment, the semiconductor package 1000*e* is not limited to the semiconductor package 1000*b* or 1000*c* of the exemplary embodiments of FIG. 3A or 3B. For example, the semiconductor package 1000*e* may include one semiconductor chip 100 or 100*a* like the semiconductor package 1000 or 1000*a* of the exemplary embodiments of FIG. 1A or 2, or may include two, three, or five or more semiconductor chips.

In the semiconductor device 10000 shown in the exemplary embodiments of FIGS. 5A and 5B, four semiconductor packages 1000*e* are mounted on (e.g., disposed on) the interposer 600. However, exemplary embodiments of the present inventive concepts are not limited thereto and the number of semiconductor packages 1000*e* may vary in other exemplary embodiments. For example, one to three, or five or more semiconductor packages 1000*e* may be mounted on (e.g., disposed on) the interposer 600.

The interposer 600 may include a substrate 601, an upper protection layer 603, an upper pad 605, a wiring layer 610, a bump 620, and a through electrode 630. The semiconductor package 1000*e* and the processor chip 700 may be stacked on the package substrate 500 via the interposer 600. The interposer 600 may electrically connect the semiconductor package 1000*e* and the processor chip 700 to the package substrate 500.

In an exemplary embodiment, the substrate 601 may be formed of for example, one of silicon, an organic material, plastic, and a glass substrate. However, exemplary embodiments of the present inventive concepts are not limited thereto and a material of the substrate 601 may vary. If the substrate 601 is a silicon substrate, the interposer 600 may be referred to as a silicon interposer. In addition, if the substrate 601 is an organic substrate, the interposer 600 may be referred to as a panel interposer.

The upper protection layer 603 may be disposed on an upper surface of the substrate 601, and the upper pad 605 may be disposed on the upper protection layer 603. For example, as shown in the exemplary embodiment of FIG. 5B, a lower surface of the upper protection layer 603 may directly contact an upper surface of the substrate 601 and an upper surface of the upper protection layer 603 may directly contact a lower surface of the upper pad 605. The upper pad 605 may be connected to the through electrode 630. The semiconductor package 1000*e* and the processor chip 700 may be stacked on the interposer 600 via bumps 120*e* disposed on the upper pad 605.

A wiring layer 610 may be disposed on a lower surface of the substrate 601. For example, as shown in the exemplary embodiment of FIG. 5B, an upper surface of the wiring layer 610 may directly contact a lower surface of the substrate 601. The wiring layer 610 may have a single-layer or multi-layer wiring structure. In an exemplary embodiment in which the wiring layer 610 has a multi-layer wiring structure, the wiring lines of different layers may be connected to each other through a vertical contact.

The through electrode 630 may extend from the upper surface to the lower surface of the substrate 601 to penetrate the substrate 601. For example, the through electrode 630 may penetrate an entire thickness of the substrate 601. In addition, the through electrode 630 may extend into the wiring layer 610 to be electrically connected to the wiring lines of the wiring layer 610. In an exemplary embodiment in which the substrate 601 is composed of silicon, the through electrodes 630 may be referred to as a TSV. The structures or materials of the TSV may be the same as that described above with regard to the TSV 230 of the base chip 200 in the semiconductor package 1000*b* of the exemplary embodiment of FIG. 3A. However, exemplary embodiments of the present inventive concepts are not limited thereto. For example, in an exemplary embodiment, the interposer 600 may include only the wiring layer therein and may not include the through electrode 630.

In the semiconductor device 10000 according to the exemplary embodiments of FIGS. 5A-5B, the interposer 600 may be used to convert or transfer an input electrical signal between the package substrate 500 and the semiconductor package 1000*e* or the processor chip 700. Accordingly, the interposer 600 may not include devices such as active devices or passive devices. In the interposer 600, although the wiring layer 610 is disposed under the through electrode 630, according to an exemplary embodiment, the wiring layer 610 may be disposed directly on the through electrode 630. For example, the location relationship between the wiring layer 610 and the through electrode 630 may be relative to each other.

The bump 620 may be disposed on a lower surface of the interposer 600 and may be electrically connected to the wiring line of the wiring layer 610. The interposer 600 may be stacked on the package substrate 500 via the bump 620. The bump 620 may be connected to the upper pad 605 through the wiring lines of the wiring layer 610 and the through electrode 630. However, among the upper pads 605, the upper pads 605 used for power or ground may be integrated and connected to the bump 620 together. Therefore, the number of upper pads 605 may be greater than the number of bumps 620.

In an exemplary embodiment, the processor chip 700 may be a GPU, a CPU, or an SOC chip. The semiconductor device 10000 may be classified into a server-oriented semiconductor device, a mobile-oriented semiconductor device, etc., according to the types of devices included in the processor chip 700.

The semiconductor device 10000 may also include an internal sealing material that covers lateral sides and upper surfaces of semiconductor package 1000*e* and the processor chip 700 on the interposer 600. In addition, the semiconductor device 10000 may include an external sealing material that covers the interposer 600 and the internal sealing material on the package substrate 500. In an exemplary embodiment, the external sealing material and the internal sealing material may be formed together and thus may not be distinguished from each other. In addition, according to an exemplary embodiment, the internal sealing material may cover only the upper surface of the processor chip 700 and may not cover the upper surface of the semiconductor package 1000*e*.

The external connection terminal 510, such as a solder ball, etc., may be disposed under the package substrate 500. Accordingly, the semiconductor device 10000 may be mounted on (e.g., disposed on) another external board such as a system board or a motherboard, via the external connection terminal 510.

For reference, although a structure of the semiconductor device 10000 according to this exemplary embodiment is referred to as a 2.5D package structure, the 2.5D package structure may be a relative concept to a 3D package structure in which all semiconductor chips are stacked together and there is no interposer. The 2.5D package structure and the 3D package structure may be included in a system in package (SIP) structure. The semiconductor device 10000 may also be a type of semiconductor package. However, since the semiconductor device 10000 includes the semiconductor package 1000*e* such as the semiconductor package 1000*b* or 1000*c* of the exemplary embodiments of FIG. 3A or 3B, the semiconductor device 1000 is referred to as a semiconductor device to be distinguished from the semiconductor package 1000*e* in terms of the terminology. Hereinafter, the same concept may be applied to semiconductor devices 10000*a* and 10000*b* of the exemplary embodiments of FIGS. 6 and 7.

In the semiconductor device 10000 according to this exemplary embodiment, the semiconductor package 1000*e* and the processor chip 700 may be stacked on a wide prototype interposer by using the bump 120*e* and an adhesive film 300*e* through the foil lamination process and the pressurized reflow process. A singulation process may then be performed on the prototype interposer, thereby implementing a structure in which the semiconductor package 1000*e* and the processor chip 700 are mounted on (e.g., disposed on the interposer 600. In this exemplary embodiment, as described above with respect to the semiconductor packages 1000 and 1000*a* to 1000*d*, a width of an outer film portion of the adhesive film 300*e* may be substantially uniform within a deviation range, and the bump of each of the semiconductor package 1000*e* and the processor chip 700 may maintain a substantially uniform height within a deviation range throughout the semiconductor package 1000*e* and the processor chip 700, respectively.

Figure 6:
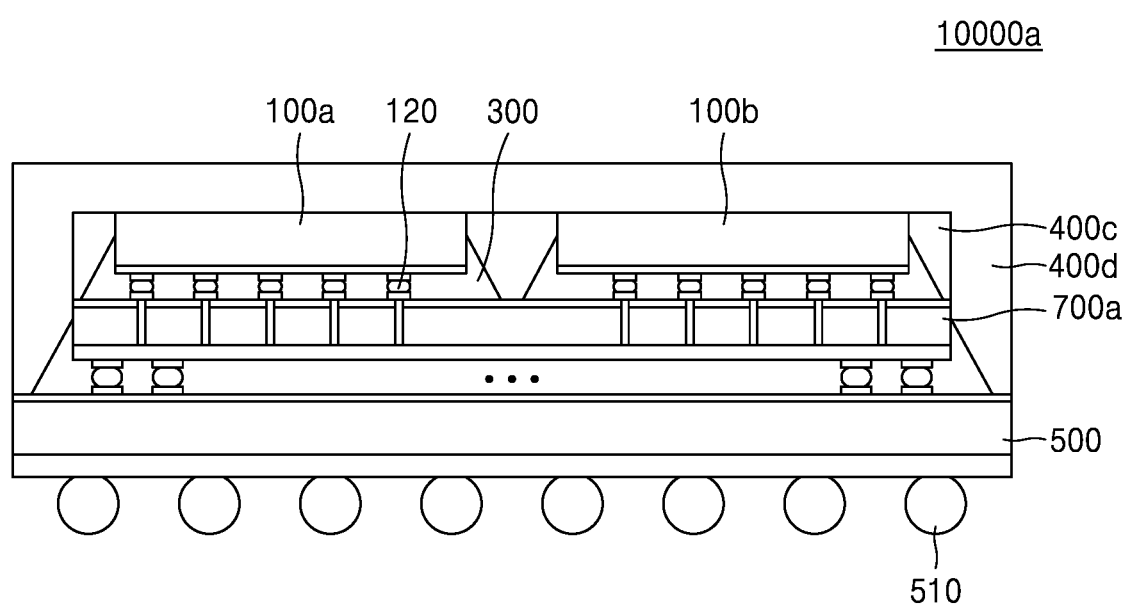
FIG. 6 is a cross-sectional view of a semiconductor device according to an exemplary embodiment of the present inventive concepts.

FIG. 6 is a cross-sectional view of a semiconductor device according to an exemplary embodiment of the present inventive concepts. Descriptions of substantially identical elements previously given with respect to the exemplary embodiments of FIGS. 1 to 5B will be briefly given or omitted for convenience of explanation.

Referring to the exemplary embodiment of FIG. 6, the semiconductor device 10000*a* may include memory chips, for example first and second memory chips 100*a* and 100*b*, a logic chip 700*a*, the package substrate 500, an internal sealing material 400*c*, and an external sealing material 400*d*.

The first and second memory chips 100*a* and 100*b*, may be mounted on (e.g., disposed on) the logic chip 700*a*. In an exemplary embodiment, the first and second memory chips 100*a* and 100*b* may be the same type of memory chip. For example, the first and second memory chips 100*a* and 100*b*, may both be SRAM chips. However, in another exemplary embodiment, the first and second memory chips 100*a* and 100*b*, may be different types of memory chips. For example, the first memory chip 100a may be an SRAM chip, and the second memory chip 100b may be a DRAM chip.

While the exemplary embodiment of FIG. 6 includes two memory chips, the number of memory chips stacked on the logic chip 700a is not limited to two. For example, in other exemplary embodiments, one, or three or more memory chips may be stacked on the logic chip 700a. In addition, the memory chip is not limited to an SRAM chip or a DRAM chip. For example, the various types of memory chips described above may be included in the semiconductor device 10000a of the exemplary embodiment of FIG. 6. Furthermore, a memory package may be mounted on (e.g., disposed on) the logic chip 700a instead of the first and second memory chips 100a and 100b. The memory package may include at least two memory chips. In addition, in some exemplary embodiments, two or more memory packages may be mounted on the logic chip 700a.

The logic chip 700a may be mounted on (e.g., disposed on) the package substrate 500. The logic chip 700a may be various types of processor chips such as GPU, CPU, and SOC chips. The internal sealing member 400c may cover the first and second memory chips 100a and 100b on the logic chip 700a. For example, the internal sealing member 400c may cover the lateral edges of the first and second memory chips 100a and 100b. In addition, the external sealing member 400d may cover the logic chip 700a, the first and second memory chips 100a and 100b, and the internal sealing member 400c on the package substrate 500. For example, as shown in the exemplary embodiment of FIG. 6, the external sealing member 400d may directly contact upper and lateral side surfaces of the internal sealing member 400c and an upper surface of the first and second memory chips 100a, 100b. The external connection terminal 510, such as a solder ball, etc., may be disposed under the package substrate 500. Accordingly, the semiconductor device 10000a may be mounted on another external board such as a system board or a motherboard, via the external connection terminal 510. The semiconductor device 10000a according to the exemplary embodiment of FIG. 6 may be referred to as the 3D package structure since the logic chip 700a is stacked on the package substrate 500 and the first and second memory chips 100a and 100b are stacked on the logic chip 700a.

In the semiconductor device 10000a according to the exemplary embodiment of FIG. 6, the first and second memory chips 100a and 100b may be stacked on the logic chip 700a having a wafer shape by using the bump 120 and the adhesive film 300 through the foil lamination process and the pressurized reflow process. A singulation process may then be performed on the wafer, thereby implementing a structure in which the first and second memory chips 100a and 100b are mounted on the logic chip 700a. In this exemplary embodiment, as described above with respect to the semiconductor packages 1000 and 1000a to 1000d, the width of the outer film portion of the adhesive film 300 may be substantially uniform within a deviation range, and the bump of each of the first and second memory chips 100a and 100b may maintain a substantially uniform height within a deviation range throughout the corresponding semiconductor chip.

Figure 7:
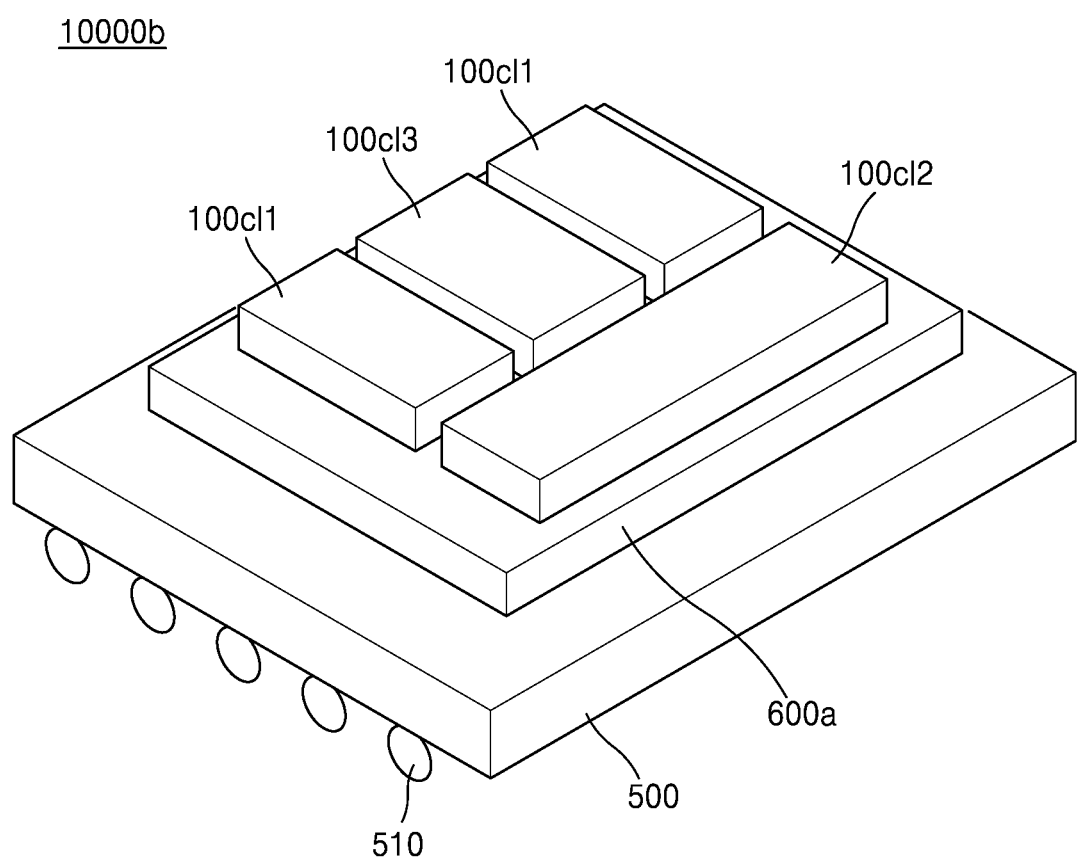
FIG. 7 is a perspective view of a semiconductor device according to an exemplary embodiment of the present inventive concepts.

FIG. 7 is a perspective view of a semiconductor device according to an exemplary embodiment of the present inventive concepts. Descriptions of substantially identical elements previously given with respect to the exemplary embodiments of FIGS. 1 to 6 will be briefly given or omitted for convenience of explanation.

Referring to the exemplary embodiment of FIG. 7, a semiconductor device 10000b may include chiplets, for example, first, second, and third chiplets 100c/1, 100c/2 and 100c/3, an active interposer 600a, and the package substrate 500. Each of the first, second, and third chiplets 100c/1, 100c/2, and 100c/3 may refer to one of chips constituting a multi-chip module (MGM). In an exemplary embodiment, the MCM may include I/O, CPU, GPU, and field programmable gate array (FPGA) chips, or the like. For example, in the exemplary embodiment of FIG. 7, the first chiplet 100c/1 may be a GPU chip, the second chiplet 100c/2 may be a CPU chip, and the third chiplet 100c/3 may be an FPGA chip. The active interposer 600a may function as an I/O chip. For example, the active interposer 600a may include an I/O device, a DC/DC converter, a sensor, a test circuit, or the like therein. Accordingly, the first, second, and third chiplets 100c/1, 100c/2 and 100c/3 and the active interposer 600a may constitute an MCM. In the semiconductor device 10000b according to this exemplary embodiment, the first, second, and third chiplets 100c/1, 100c/2 and 100c/3 are not limited to the GPU, CPU and FGA chips described above. In addition, the number of chiplets stacked on the active interposer 600a is also not limited to three. For example, one, two, or four or more chiplets may be stacked on the active interposer 600a.

Recently, due to the limitations in miniaturization of system on chip (SoC) products and the increases in costs and development periods, chip patterning technologies or chiplet technologies have been actively studied in which main functions of devices are further divided and node processes suitable for characteristics of devices are individually applied. For example, the terms 'chiplet' and 'chiplet technology' may refer to a semiconductor chip manufactured having a distinction according to the sizes and functions of devices, and a technology for manufacturing the semiconductor chip.

The semiconductor device 10000b according to this exemplary embodiment may have a structure in which each of the first, second, and third chiplets 100c/1, 100c/2 and 100c/3 is stacked and integrated on the active interposer 600a based on the chiplet technology. In addition, in the semiconductor device 10000b according to this exemplary embodiment, the first, second, and third chiplets 100c/1, 100c/2 and 100c/3 may be stacked on a wide prototype active interposer by using the bump and the adhesive film through the foil lamination process and the pressurized reflow process. A singulation process may then be performed on the prototype active interposer, thereby implementing a structure in which the first, second, and third chiplets 100c/1, 100c/2 and 100c/3 are mounted on (e.g., disposed on) the active interposers 600a. Accordingly, the width of the outer film portion of the adhesive film is uniform within a range, and a bump of each of the first, second, and third chiplets 100c/1, 100c/2 and 100c/3 may maintain a substantially uniform height throughout the corresponding chiplet. As a result, the semiconductor device 10000b according to this exemplary embodiment may improve the yield of the MCM to maximize the productivity.

Figure 9A:
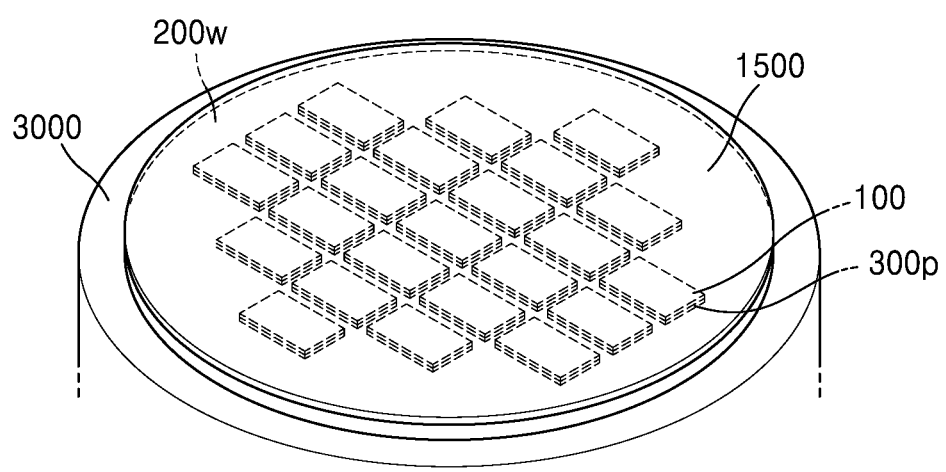
Figure 9B:
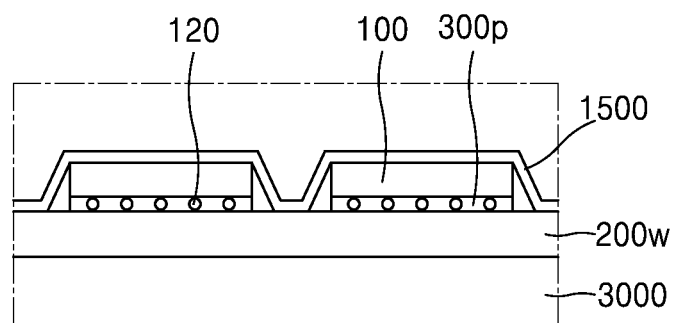
Figure 10A:
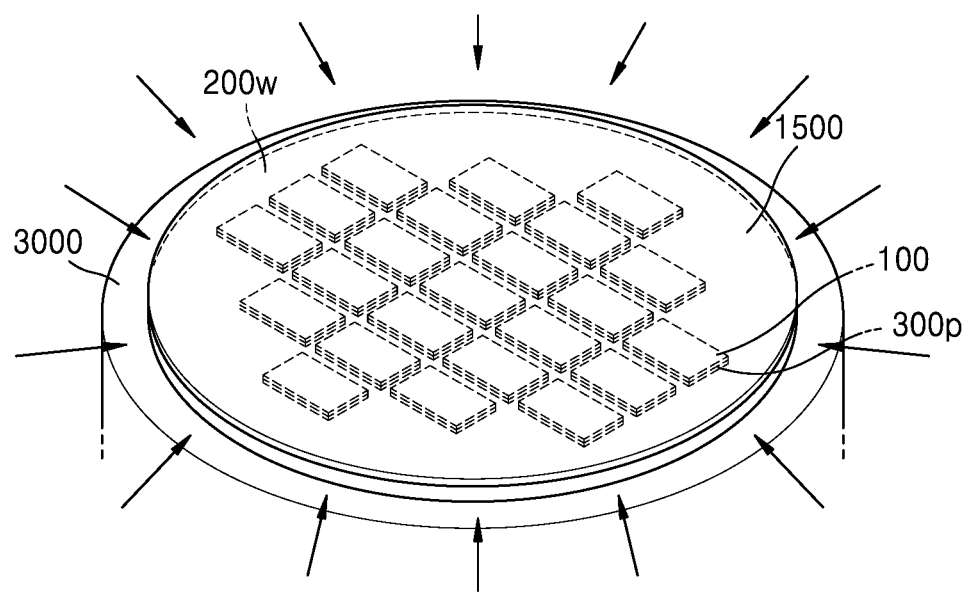
Figure 10B:
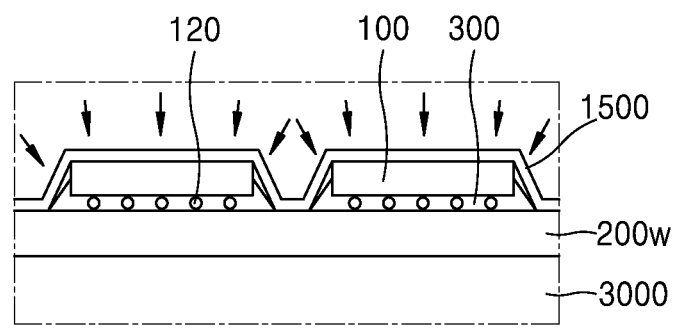
Figure 11:
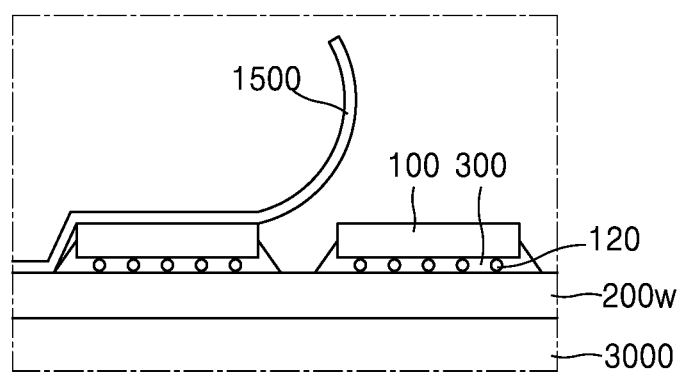
Figure 12:
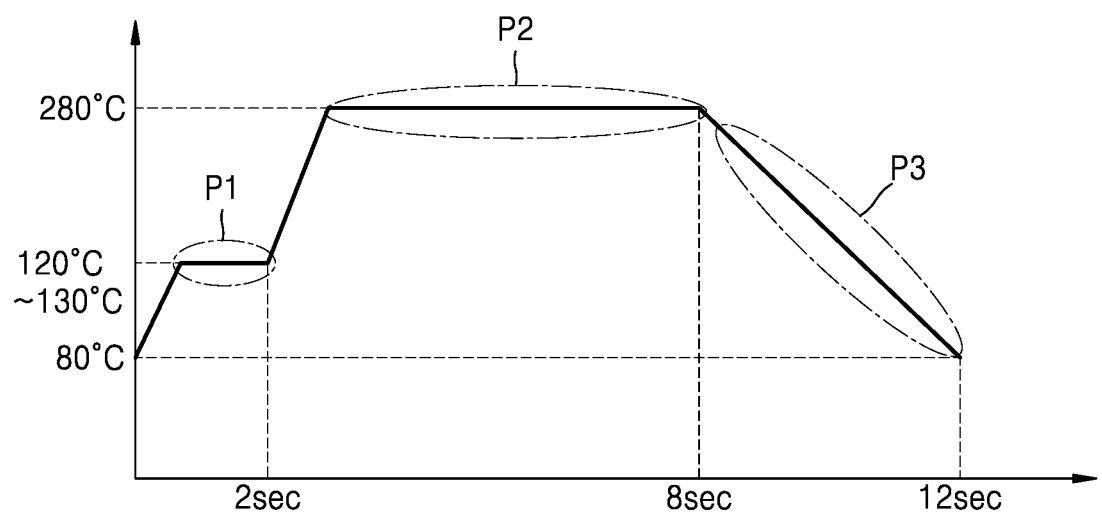
FIG. 12 is a graph showing changes in the temperature over time in a pressurized reflow process of FIG. 10A.

FIGS. 8A to 11 are perspective views and cross-sectional views showing a method of manufacturing the semiconductor package of FIG. 1A according to exemplary embodiments of the present inventive concepts, and FIG. 12 is a graph showing changes in the temperature over time in a pressurized reflow process of FIG. 10A. The description will be made with reference to the exemplary embodiments of FIGS. 1A and 1B, and descriptions of substantially identical elements previously given will be briefly given or omitted for convenience of explanation.

Figure 8A:
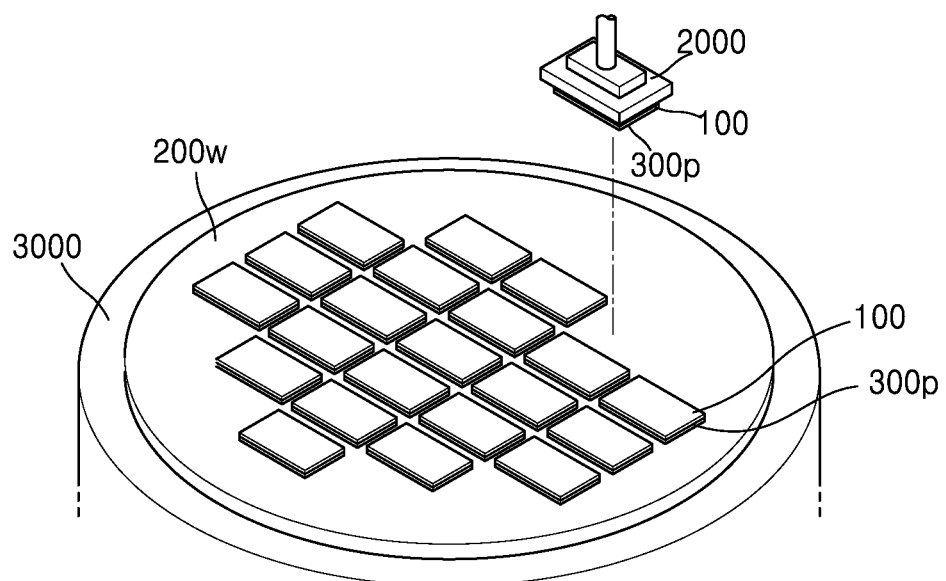
FIGS. 8A to 11 are perspective views and cross-sectional views showing a method of manufacturing the semiconductor package of FIG. 1A according to exemplary embodiments of the present inventive concepts.
Figure 8B:
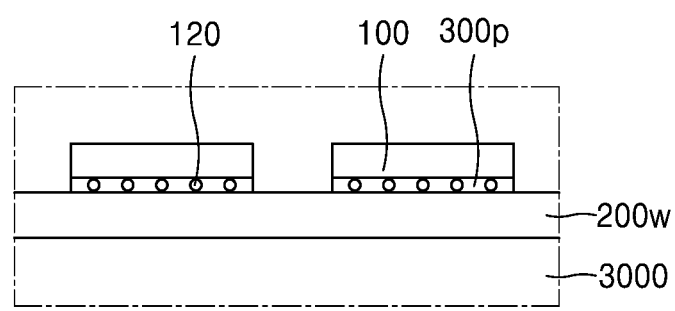

Referring to the exemplary embodiments of FIGS. 8A and 8B, the semiconductor chip 100 is pre-bonded onto a wafer 200w arranged on an electrostatic chuck 3000 using an adhesive film 300p. The wafer 200w may include a plurality of base chips (refer to 200 of FIG. 1A). The semiconductor chip 100 may be aligned with the corresponding base chip 200 through a pick-and-place device 2000 and may be pre-bonded. For example, the semiconductor chip 100 may be aligned with the base chip 200 such that the bump 120 of the semiconductor chip 100 contacts the corresponding upper pad 205 of the base chip 200. The pick-and-place device 2000 is shown in FIG. 8A in which an adsorption portion is simplified.

The adhesive film 300p may cover the bump 120 on the lower surface of the semiconductor chip 100 while maintaining a solid state and having low fluidity in a state before the pressurized reflow process. The pick-and-place device 2000 may pick up the semiconductor chip 100 to which the adhesive film 300p is attached and may pre-bond the semiconductor chip 100 to the corresponding base chip 200 of the wafer 200w. The adhesive film 300p may fix the semiconductor chip 100 to the corresponding base chip 200 with a degree of adhesive three.

For reference, the pre-bonding may refer to a process in which a semiconductor chip is simply placed on a corresponding base chip without applying pressure or heat and the semiconductor chip is fixed by only an adhesive force of the solid-state adhesive film 300p, and may be a concept corresponding to TCB. In a conventional semiconductor chip stacking process, because TCB is generally performed after pre-bonding, the TCB may be referred to as post-bonding. In the method of manufacturing a semiconductor package according to this exemplary embodiment, the TCB may be included in the pre-bonding process.

Referring to the exemplary embodiments of FIGS. 9A and 9B, the semiconductor chip 100 is pre-bonded onto the wafer 200w, and then the foil lamination process is performed to cover all the semiconductor chips 100 on the wafer 200w with a foil 1500. In an exemplary embodiment, the foil 1500 may be, for example, a polyimide (PI) film. However, the foil 1500 used in the foil lamination process is not limited to the PI film. For example, in other exemplary embodiments, the foil 1500 may include various polymer materials having heat resistance. The foil 1500 may be coated with a removal adhesive on a lower surface thereof and may be easily removed. For example, the foil 1500 may be removed through UV irradiation.

The foil 1500 may have a size to cover all of the semiconductor chips 100 on the wafer 200w. For example, in an exemplary embodiment, the foil 1500 may have a size that is substantially identical to or slightly greater than the size of the wafer 200w.

As shown in the exemplary embodiment of FIG. 9B, the foil 1500 may cover the upper surface of the semiconductor chip 100 and may extend at an inclined angle to cover the lateral sides of the semiconductor chip 100. However, an inclination at which the foil 1500 covers the lateral sides of the semiconductor chip 100 may vary according to a distance between the adjacent semiconductor chips 100 and the height of the semiconductor chip 100. For example, if the semiconductor chip 100 is relatively thin and a distance to the adjacent semiconductor chip is sufficient, the foil 1500 may cover the lateral sides of the semiconductor chip 100 with an inclination close to vertical (e.g., close to a direction perpendicular to an upper surface of the wafer 200w). However, in exemplary embodiments in which the semiconductor chip 100 is relatively thick and a distance to the adjacent semiconductor chip 100 is relatively large, for example, the foil 1500 may cover the lateral sides of the semiconductor chip 100 with an inclination close to about 45°.

Referring to the exemplary embodiments of FIGS. 10A, 10B, and 12, after performing the foil lamination process on the semiconductor chip 100, the pressurized reflow process is performed. As described above, the pressurized reflow process may refer to a process of reflowing the adhesive film 300p by applying heat while maintaining a constant pressure in a process chamber. In the pressurized reflow process of this exemplary embodiment, the applied pressure may be in a range of about 0.5 MPa to about 3 MPa. However, exemplary embodiments of the present inventive concepts are not limited thereto and a range of the pressure may vary in other exemplary embodiments. The pressure may be constantly maintained throughout the pressurized reflow process, or may be changed as the process is performed. For example, as the process is performed to suppress warpage of the semiconductor chip 100, the pressure may increase.

In the exemplary embodiments of FIGS. 10A and 10B, the pressure applied to the semiconductor chip 100 or the foil 1500 that covers the semiconductor chip 100 is indicated by arrows. The pressure applied in the pressurized reflow process may be a hydrostatic pressure, and a magnitude of the pressure applied to an arbitrary surface of the semiconductor chip 100 or the foil 1500 may be constant regardless of a direction. For example, in the exemplary embodiment shown in FIG. 10B, the arrows may refer to pressures having the same magnitude.

In the pressurized reflow process, as shown in the graph of FIG. 12, heat may be applied while changing the temperature in stages. For example, a section P1 may be a pre-heating section, and may minimize the trap of the adhesive film 300, for example, an NCF, in a joint interface. In addition, in the section P1, a flow of a low viscosity section of the NCF may occur. As shown in the exemplary embodiment of FIG. 12, the temperature applied during section P1 may be about 120° C. However, exemplary embodiments of the present inventive concepts are not limited thereto. A section P2 is a dwelling section, which is a peak temperature section, curing of the NCF initiates, and wetting of the solder 124 of the bump 120 may be performed. As shown in the exemplary embodiment of FIG. 12, the temperature applied during section P2 may be about 280° C. and section P2 may last for approximately 6 seconds. However, exemplary embodiments of the present inventive concepts are not limited thereto. A section P3 is a cooling section, and the void of the NCF may be minimized. In an exemplary embodiment, the cooling section may be modified according to intrinsic capabilities of equipment. As shown in the exemplary embodiment of FIG. 12, the temperature may decrease during section P3 from about 280° C. to about 80° C. and section P3 may last for approximately 3 seconds. However, exemplary embodiments of the present inventive concepts are not limited thereto.

In the method of manufacturing a semiconductor package according to this exemplary embodiment, a temperature curve with respect to heat in the pressurized reflow process is not limited the temperature curve shown in FIG. 12. For example, the temperature curve may be modified into various configurations according to the material or thickness of the adhesive film 300, the material or size of the solder 124 of the bump 120, the size of the semiconductor chip 100, or the like.

In comparative embodiments in which the pressurized reflow process is performed without the lamination process, not-wetting and open defects may occur at a lateral edge portion of the semiconductor chip 100 due to warpage of the semiconductor chip 100 at a high temperature. In addition, the outer film portion of the adhesive film 300, such as the filet of the adhesive film 300 may be not uniform. For example, a filet 310 of the adhesive film 300 at a lateral edge portion of the semiconductor chip 100 that is far from the center of the semiconductor chip 100 may have a small width or a minus width due to insufficient filling. In contrast, the filet 310 of the adhesive film 300 at a side of the semiconductor chip 100 that is close to the center may have a relatively large width.

On the other hand, if the pressurized ram process is performed together with the foil lamination process, warpage of the semiconductor chip 100 may be suppressed, and not-wetting and open defects at a lateral edge portion of the semiconductor chip 100 may be effectively prevented. In addition, the outer film portion of the adhesive film 300 may be substantially uniformly maintained within a range. Furthermore, overflow of the adhesive film 300, which may occur during the pressurized reflow process, in which the adhesive film 300 intrudes the upper surface of the semiconductor chip 100, surface contamination of the semiconductor chip 100 and the base chip 200 due to foreign substances, and contamination in the process chamber due to flux fume or fine particles may be prevented.

Referring to the exemplary embodiment of FIG. 11, after the pressurized reflow process is performed, the foil 1500 is removed. In an exemplary embodiment, the foil 1500 may be removed by, for example, UV irradiation.

The semiconductor package 1000 of FIG. 1A may then be manufactured by singulating each of the base chips 200 in the wafer 200w. The sealing material 400 may be formed with respect to each of the base chips 200. In an exemplary embodiment, the sealing material 400 may be formed by applying a sealant material to all the semiconductor chips 100 on the wafer 200w and then singulating the sealant material with the base chip 200.

FIGS. 13A to 13D are cross-sectional views showing a process of manufacturing a semiconductor package having a structure in which two semiconductor chips are stacked on a base chip according to exemplary embodiments of the present inventive concepts, and correspond to FIGS. 8B, 9B, 10B, and 11, respectively. The description will be made with reference to FIGS. 1A to 3B, and descriptions of substantially identical elements previously given with respect to FIGS. 1A to 3B and FIGS. 8A to 12 will be briefly given or omitted for convenience of explanation.

Figure 13A:
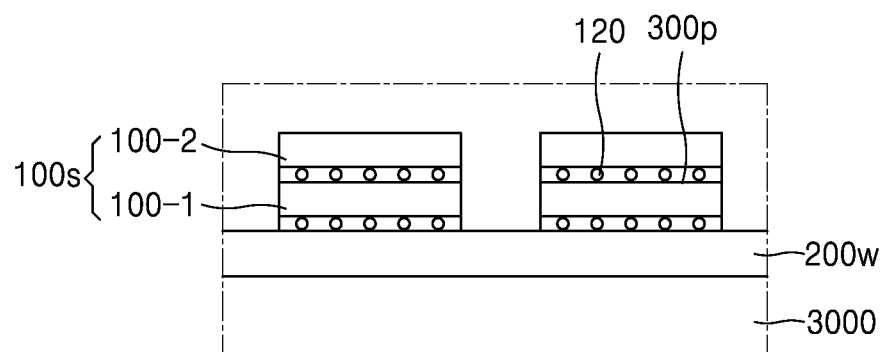
FIGS. 13A to 13D are cross-sectional views showing a process of manufacturing a semiconductor package having a structure in which two semiconductor chips are stacked on a base chip according to exemplary embodiments of the present inventive concepts.

Referring to the exemplary embodiment of FIG. 13A, a chip stack 100s is pre-bonded onto the wafer 200w disposed on the electrostatic chuck 3000. The chip stack 100s may include the first semiconductor chip 100-1 and the second semiconductor chip 100-2. In an exemplary embodiment, the pre-bonding of the chip stack 100s may be performed, for example, by pre-bonding the first semiconductor chip 100-1 onto the wafer 200w and then pre-bonding the second semiconductor chip 100-2 onto the first semiconductor chip 100-1. However, exemplary embodiments of the present inventive concepts are not limited thereto. For example, in another exemplary embodiment, the pre-bonding of the chip stack 100s may be performed by pre-bonding the second semiconductor chip 100-2 onto the first semiconductor chip 100-1 to form the chip stack 100s, and then pre-bonding the chip stack 100s onto the wafer 200w. The pre-bonding of the chip stack 100s may be performed using the pick-and-place device (refer to 2000 of FIG. 8).

Figure 13B:
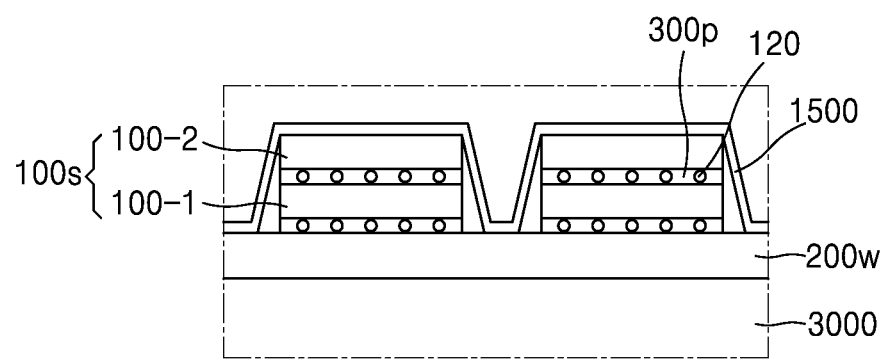

Referring to the exemplary embodiment of FIG. 13B, the foil lamination process is performed to cover all of the chip stacks 100s on the wafer 200w with the foil 1500. Since the chip stack 100s has a thickness that is greater than a thickness of one semiconductor chip, the foil 1500 may cover the lateral sides of the chip stack 100s with a certain degree of inclination.

Figure 13C:
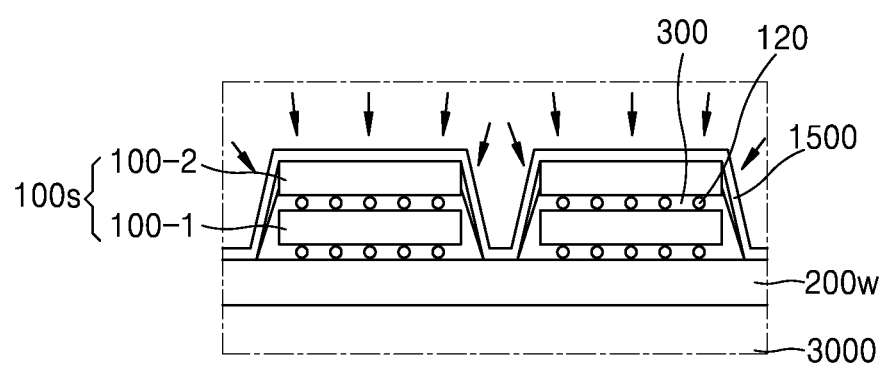

Referring to the exemplary embodiment of FIG. 13C, after the foil lamination process is performed on the chip stacks 100s, the pressurized reflow process is performed. The pressure and heat applied in the pressurized reflow process are the same as those described with reference to FIGS. 10A, 10B, and 12. In an exemplary embodiment, the adhesive films 300p attached to the first semiconductor chip 100-1 and the second semiconductor chip 100-2 may be reflowed together in the pressurized reflow process, and thus the adhesive film 300 may have an integrated structure in which they are not distinguished from each other.

Figure 13D:
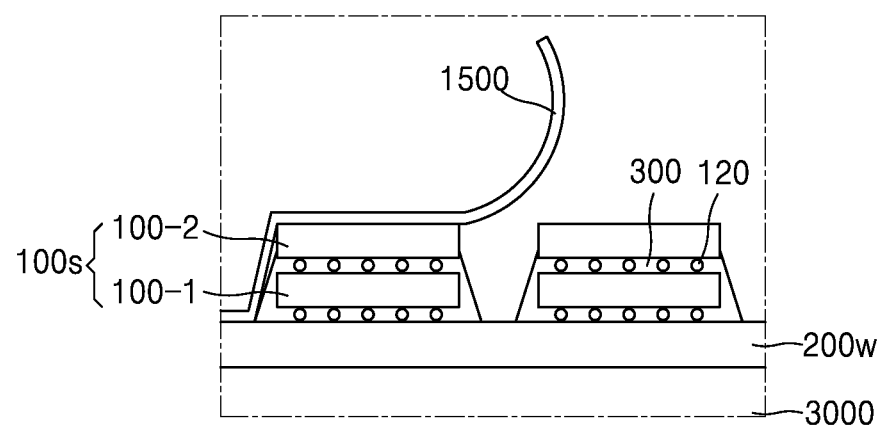

Referring to the exemplary embodiment of FIG. 13D, after the pressurized reflow process, the foil 1500 is removed. After the foil 1500 is removed, the semiconductor package in which the first and second semiconductor chips 100-1 and 100-2 are stacked on the base chip 200 may be manufactured through a singulation process. If four semiconductor chips are stacked on the base chip 200 through the process described above, the semiconductor package 1000b as shown in the exemplary embodiment of FIG. 3A may be manufactured.

In an exemplary embodiment, the foil lamination process and the pressurized reflow process may be performed on the semiconductor chips for each layer, rather than the entire chip stack 100s. For example, the semiconductor package in which the two semiconductor chips 100-1 and 100-2 are stacked on the base chip 200 may be manufactured by performing the pre-bonding, foil lamination, pressurized reflow, and foil removal processes on the first semiconductor chip 100-1 on the wafer 200w, again performing the pre-bonding, foil lamination, pressurized reflow, and foil removal processes on the second semiconductor chip 100-2 on the first semiconductor chip 100-1, and performing the singulation process. In this exemplary embodiment, the first adhesive film portion (refer to 300-1 of FIG. 3B) of the first semiconductor chip 100-1 and the second adhesive film portion (refer to 300-2 of FIG. 3B) of the second semiconductor chip 100-2 may be distinguished from each other by the boundary surface (refer to BS of FIG. 3B) due to the pressurized reflow process being performed on each of the adhesive film 300p of the first semiconductor chip 100-1 and the adhesive film 300p of the second semiconductor chip 100-2. If four semiconductor chips are stacked on the base chip 200 through the process described above, the semiconductor package 1000c as shown in the exemplary embodiment of FIG. 3B may be manufactured.

While the present inventive concepts have been particularly shown and described with reference to exemplary embodiments thereof, it will be understood that various changes in form and details be made therein without departing from the spirit and scope of the present inventive concepts. Therefore, the present inventive concepts are not limited to the exemplary embodiments described herein.

What is claimed is:

1. A method of manufacturing a semiconductor package comprising:
   arranging a wafer on an electrostatic chuck, the wafer including a plurality of base chips;

pre-bonding at least one semiconductor chip on the wafer using an adhesive film;
performing a foil lamination process to cover the at least one semiconductor chip on the wafer with a foil;
performing a pressurized reflow process, wherein the pressurized reflow process is a process of reflowing the adhesive film by applying heat while maintaining a constant pressure in a process chamber; and
removing the foil.

2. The method of claim 1,
wherein after the pressurized reflow process, the adhesive film includes an inner film portion that overlaps the at least one semiconductor chip in a thickness direction of the base chip, and an outer film portion that does not overlap the at least one semiconductor chip in the thickness direction of the base chip, and
wherein a width of the outer film portion in a direction perpendicular to a lateral edge of the at least one semiconductor chip is substantially uniform within a deviation range of 20% of an average width of the outer film portion.

3. The method of claim 2,
wherein at least one semiconductor chip has a rectangular shape, and
the following Equation (1) is satisfied, $$Ws - Wc \leq Ws*0.2 \qquad \text{<Equation (1)>}$$

wherein Ws is a width of the outer film portion adjacent to the lateral edge of the at least one semiconductor chip, Wc is a width of the outer film portion adjacent to a vertex of the at least one semiconductor chip, and Ws and Wc are greater than 0.

4. The method of claim 1,
wherein at least one semiconductor chip is aligned with a corresponding base chip.

5. The method of claim 1,
wherein at least one semiconductor chip is plural, and the foil has substantially the same size as the wafer.

6. The method of claim 1,
wherein the foil comprises a polyimide (PI) film, and the removing the foil comprises removing the foil by UV irradiation.

7. The method of claim 1,
wherein pressure applied in the pressurized reflow process is constant regardless of a direction as a hydrostatic pressure.

8. The method of claim 1,
wherein the pressurized reflow process comprises a pre-heating section, a dwelling section, and a cooling section, the dwelling section is a peak temperature section, and wetting of a solder is performed during the dwelling section.

9. The method of claim 1, further comprising:
sealing at least one semiconductor chip on the wafer; and
completing the semiconductor package by a singulating process.

10. The method of claim 1, further comprising:
before the performing a foil lamination process, pre-bonding an upper semiconductor chip on at least one semiconductor chip on the wafer.

11. The method of claim 1,
wherein the base chip includes an interface chip; and at least one semiconductor chip includes a memory chip.

12. A method of manufacturing a semiconductor package comprising:
arranging a wafer on an electrostatic chuck, the wafer including a plurality of base chips;
pre-bonding at least one chip stack on the wafer using an adhesive film;
performing a foil lamination process to cover the at least one chip stack on the wafer with a foil;
performing a pressurized reflow process, wherein the pressurized reflow process is a process of reflowing the adhesive film by applying heat while maintaining a constant pressure in a process chamber;
removing the foil;
sealing the at least one chip stack on the wafer; and
completing the semiconductor package by a singulating process.

13. The method of claim 12,
wherein at least one chip stack includes at least two semiconductor chips sequentially stacked.

14. The method of claim 13,
wherein the pre-bonding at least one chip stack on the wafer comprises:
pre-bonding a semiconductor chip located at the bottom of at least one chip stack on the wafer; and
pre-bonding an upper semiconductor chip on a lower semiconductor chip.

15. The method of claim 13,
wherein the pre-bonding at least one chip stack on the wafer comprises:
forming at least one chip stack; and
pre-bonding at least one chip stack on the wafer.

16. The method of claim 12,
wherein after the pressurized reflow process, the adhesive film includes an inner film portion that overlaps at least one chip stack in a thickness direction of the base chip, and an outer film portion that does not overlap at least one chip stack in the thickness direction of the base chip, and
wherein a width of the outer film portion in a direction perpendicular to a lateral edge of at least one chip stack is substantially uniform within a deviation range of 20% of an average width of the outer film portion.

17. The method of claim 16,
wherein at least one chip stack has a rectangular shape, and
the following Equation (1) is satisfied, $$Ws - Wc \leq Ws*0.2 \qquad \text{<Equation (1)>}$$

wherein Ws is a width of the outer film portion adjacent to the lateral edge of the at least one chip stack, Wc is a width of the outer film portion adjacent to a vertex of at least one chip stack, and
Ws and Wc are greater than 0.

18. A method of manufacturing a semiconductor package comprising:
arranging a wafer on an electrostatic chuck, the wafer including a plurality of base chips;
pre-bonding at least one semiconductor chip on the wafer using an adhesive film;
performing a foil lamination process to cover at least one semiconductor chip on the wafer with a foil;
performing a pressurized reflow process, wherein the pressurized reflow process is a process of reflowing the adhesive film by applying heat while maintaining a constant pressure in a process chamber;
removing the foil;
sealing at least one semiconductor chip on the wafer; and
completing the semiconductor package by a singulating process,
wherein after the pressurized reflow process, the adhesive film includes an inner film portion that overlaps at least one semiconductor chip in a thickness direction of the base chip, and an outer film portion that does not overlap at least one semiconductor chip in the thickness direction of the base chip, and wherein a width of the outer film portion in as direction perpendicular to as lateral edge of at least one semiconductor chip is substantially uniform within a deviation range of 20% of an average width of the outer film portion.

19. The method of claim 18, wherein at least one semiconductor chip is aligned with a corresponding base chip, and the removing the foil comprises removing the foil by UV irradiation.

20. The method of claim 18, wherein the pressurized reflow process comprises a preheating section, a dwelling section, and a cooling section, the dwelling section is a peak temperature section, and wetting of a solder is performed during the dwelling section.

\* \* \* \* \*